United States Patent
Hines et al.

(10) Patent No.: US 11,151,337 B2
(45) Date of Patent: Oct. 19, 2021

(54) LOW LOSS ACOUSTIC WAVE SENSORS AND TAGS AND HIGH EFFICIENCY ANTENNAS AND METHODS FOR REMOTE ACTIVATION THEREOF

(71) Applicant: SENSANNA INCORPORATED, Hanover, MD (US)

(72) Inventors: Jacqueline H. Hines, Annapolis, MD (US); Andrew T. Hines, Annapolis, MD (US); Leland P. Solie, Apopka, FL (US); Doug Kirkpatrick, San Francisco, CA (US)

(73) Assignee: SENSANNA INCORPORATED, Arnold, MD (US)

( * ) Notice: Subject to any disclaimer, the term of this patent is extended or adjusted under 35 U.S.C. 154(b) by 0 days.

(21) Appl. No.: 16/923,138

(22) Filed: Jul. 8, 2020

(65) Prior Publication Data
US 2020/0334423 A1    Oct. 22, 2020

Related U.S. Application Data

(63) Continuation of application No. 15/205,320, filed on Jul. 8, 2016, now Pat. No. 10,747,967.
(Continued)

(51) Int. Cl.
*G01R 19/25*    (2006.01)
*G06K 7/10*     (2006.01)
(Continued)

(52) U.S. Cl.
CPC ....... *G06K 7/10069* (2013.01); *G01R 15/181* (2013.01); *G06K 7/10009* (2013.01);
(Continued)

(58) Field of Classification Search
CPC ........... G06K 7/10069; G06K 7/10009; H04B 17/364; H04B 1/0007; G01R 15/181;
(Continued)

(56) References Cited

U.S. PATENT DOCUMENTS

| 4,622,525 A | * | 11/1986 | Brown | ................. | H03H 9/0285 |
| | | | | | 310/313 D |
| 4,849,760 A | * | 7/1989 | Solie | ..................... | G01S 13/282 |
| | | | | | 342/104 |

(Continued)

OTHER PUBLICATIONS

Danicki "Theory of Surface Acoustic Wave Reversing Multistrip Coupler", Arohvbs of Acoustics, 19, 2, pp. 227-238 (1994) (Year: 1994).*
(Continued)

*Primary Examiner* — Huy Q Phan
*Assistant Examiner* — Courtney G McDonnough
(74) *Attorney, Agent, or Firm* — Nixon Peabody LLP; Jeffrey L. Costellia

(57) ABSTRACT

Enhanced surface acoustic wave (SAW) sensors and SAW sensor-tag wireless interface devices, including low loss devices, devices that enable enhanced use of time diversity for device identification, and devices suitable for use in band-limited environments (such as ISM band) and for use in ultra-wideband applications are disclosed. Antennas for use with both SAW sensors and/or tags, and wireless transceiver systems also are disclosed, including antennas suitable for operation in conductive media and in highly metallic environments, said antennas being used to activate and read said SAW sensors and/or tags. SAW sensors and sensor-tags and related methods for measuring scaled voltage and current in electrical conductors via measurements of the electric and magnetic fields thereof are disclosed.

3 Claims, 17 Drawing Sheets

Related U.S. Application Data

(60) Provisional application No. 62/189,936, filed on Jul. 8, 2015.

(51) Int. Cl.
 *G01R 15/18* (2006.01)
 *H04B 17/364* (2015.01)
 *H04B 1/00* (2006.01)
 *H02J 50/80* (2016.01)
 *H02J 50/12* (2016.01)

(52) U.S. Cl.
 CPC ......... *H04B 1/0007* (2013.01); *H04B 17/364* (2015.01); *G01R 19/2509* (2013.01); *H02J 50/12* (2016.02); *H02J 50/80* (2016.02)

(58) Field of Classification Search
 CPC ...... G01R 19/2509; H02J 50/80; H02J 50/12; H01L 41/04; H01F 38/14
 USPC ...... 324/76.11, 76.39, 76.49, 109, 126, 127; 181/139, 400; 367/140, 155, 157, 178, 367/180
 See application file for complete search history.

(56) References Cited

U.S. PATENT DOCUMENTS

| | | |
|---|---|---|
| 6,121,892 A | 9/2000 | Reindl et al. |
| 6,664,708 B2 | 12/2003 | Shlimak |
| 7,356,343 B2 | 4/2008 | Feher |
| 2006/0192001 A1 | 8/2006 | Forster |
| 2006/0192002 A1 | 8/2006 | Forster |
| 2006/0267733 A1 | 11/2006 | Steinke et al. |
| 2007/0107516 A1 | 5/2007 | Fujimoto |
| 2008/0267733 A1 | 10/2008 | Kato |
| 2009/0206844 A1 | 8/2009 | Sabah |
| 2010/0060429 A1 | 3/2010 | Hines et al. |
| 2010/0066209 A1 | 3/2010 | Saitou |
| 2014/0153674 A1 | 6/2014 | Stratigos, Jr. |
| 2014/0167740 A1 | 6/2014 | Gilbert |
| 2015/0117157 A1 | 4/2015 | Li |

OTHER PUBLICATIONS

Danicki "New Configuration of Saw Resonator" Electronics Letters Jun. 24, 1993 vol. 29 No. 13, pp. 1172-1173 (hereinafter referred to as Danicki Resonator) (Year: 1993).*

International Search Report for PCT/US2016/041502 ated Sep. 30, 2016 (1 page).

Lambert, J., "A radar interrogator for wireless passive temperature sensing," 114 pages, 2011, retrieved on Aug. 30, 2016 from <http:etd.fcla.edu/CF/CFE0003631/Lambert_JeffreyC_201105_MSEE.pdf>.

Ferrari, et al., "A New Architecture for Wireless Smart Sensor Based on Software Defined Radio," IEEE Transactions on Instrumentation and Measurement 60.6. 28 pages, 2011, retrieved on Aug. 31, 2016, from <https://www.researchgate.net/profile/P_Ferrari/publication/224227387_New_Architecture_for_a_Wireless_Smart_Sensor_Based_on_a_Software-Defined_Radio/links/00b7d5239d98cd390c000000.pdf>.

Vannucci et al., "A Software-Defined Radio System for Backscatter Sensor Networks," IEEE Transactions On Wireless Communications, vol. 7, No. 6, pp. 2170-2179, Jun. 2008, retrieved on Aug. 30, 2016, from <http://alumni.media.mit.edu/~aggelos/papers/twe_june08.pdf>.

International Search Report for PCT/US2016/041504 dated Nov. 10, 2016 (4 pages).

Written Opinion of International Searching Authority for PCT/US2016/041504 dated Nov. 10, 2016 (8 pages).

Written Opinion of International Searching Authority for PCT/US2016/041502 dated Sep. 30, 2016 (5 pages).

Li et al., "A Surface Acoustic Wave Passive and Wireless Sensor for Magnetic Fields, Temperature, and Humidity", IEEE Sensors Journal, vol. 15, No. 1. Jan. 2015. pp. 453-462, (Year: 2015).

Steindl et al., "Wireless Magnetic Field Sensor employing SAW—Transponder." Proceedings of the 2001 12th IEEE International Symposium on Applications of Ferroelectrics (IEEE Cat. No. 00CH37076).

Solie, "A Surface Acoustic Wave Multiplexer Using Offset Multisrip Couplers", 1974 Ultrasonics Symposium Proceedings, IEEE Cat. #74 CHO 896-1SU, pp. 153-156.

* cited by examiner

LOW LOSS ACOUSTIC WAVE SENSORS AND TAGS AND HIGH EFFICIENCY ANTENNAS AND METHODS FOR REMOTE ACTIVATION THEREOF

CROSS-REFERENCE TO RELATED APPLICATIONS

This application claims the benefit of U.S. Provisional Application No. 62/189,936, filed Jul. 8, 2015, herein incorporated by reference in its entirety.

BACKGROUND OF THE INVENTION

Field of the Invention

The field of the present invention relates to surface-launched acoustic wave devices, including surface acoustic wave devices or SAW devices. The field of the present invention also relates to antennas for use with SAW devices, and the application of SAW devices and related methods for performing measurements on electric and magnetic fields.

Description of Related Art

Acoustic Wave Sensors: Sensors based on surface-launched acoustic wave (known as surface acoustic wave or SAW) devices have been developed since the 1980's for application to physical measurements (temperature, pressure, torque, strain, etc.) and to a wide range of chemical and biological detection problems. These widely varying devices have been described in detail in the open literature, including the following: U.S. Pat. No. 7,268,662, entitled Passive SAW-based hydrogen sensor and system, U.S. Pat. No. 7,431,989, entitled SAW temperature sensor and system, U.S. Pat. No. 7,500,379, entitled Acoustic wave array chemical and biological sensor U.S. Pat. No. 7,791,249, entitled Frequency coded sensors incorporating tapers, U.S. Pat. No. 8,094,008, entitled Coded acoustic wave sensors using time diversity. U.S. Pat. No. 8,441,168, entitled SAW Sensor tags with enhanced performance, U.S. Pat. No. 9,121,754, entitled Surface Acoustic Wave Deposition Monitor for Ultra-Thin Films, U.S. Utility application Ser. No. 13/679,607 (US20130130362A1), entitled Power Spectral Density Chemical and Biological Sensor, and U.S. Utility application Ser. No. 13/694,889 (US20130181573A1), entitled Individually Identifiable Surface Acoustic Wave Sensors, Tags, and Systems.

Acoustic Wave Sensor Interrogation Systems: Acoustic wave sensor devices have been operated within a wide range of wired and wireless interrogation system architectures, which have generally been designed specifically to operate with the selected sensor(s). The system architecture is usually selected based on specific device characteristics and application requirements, and generally involves absolute or differential measurements of sensor frequency, phase, delay, amplitude, or power spectral density, and changes in these quantities with exposure to changes in target parameters, to provide the output sensor measurement. Conventional wireless interrogation system architectures include pulsed radar-like delay measurement systems, Fourier transform based measurement systems, delay line and resonator-based oscillator systems, and time-integrating correlator based interrogation systems. Radio architectures include conventional homodyne and heterodyne mix-down systems, and direct (to baseband or to near-baseband) conversion systems. Software defined radio implementations of selected interrogation systems can be advantageous, in terms of flexibility and performance.

SAW multistrip couplers: Multistrip couplers (MSCs) are broadband, low loss directional couplers that operate on freely propagating surface acoustic waves in substrates with high electromechanical coupling coefficients. These components have been understood since the early 1970's, as described by Marshall, Newton, and Paige in "Theory and Design of the Surface Acoustic Wave Multistrip Coupler," *IEE Transactions on Sonics and Ultrasonics*, Vol. SU-20, No. 2, April 1973, pp. 124-133 and in "Surface Acoustic Wave Multistrip Components and Their Applications," *IEE Transactions on Sonics and Ultrasonics*, Vol. SU-20, No. 2, April 1973, pp. 134-143. MSCs have been widely used in SAW filters and delay lines. However, advantages possible using MSCs in SAW sensors and sensor-tags have not been recognized in work found in the open literature. MSC elements can be used to redirect the acoustic beam, to transfer acoustic energy from one track to another, to distribute the acoustic signal between a number of tracks, to enhance the operation of tapped delay lines, to reflect the acoustic signal (including creating low loss nearly ideal acoustic 'mirrors' that reflect broadband acoustic signals at a single point), for suppression of triple transit, suppression of bulk waves and spurious signals (as discussed by Danicki in "Bulk Wave Transmission by a Multistrip Coupler (MSC)," *Archives of Acoustics*, 1998, pp. 125-137), and frequency modulation (among other functions), to produce high rejection and/or low loss SAW devices, ether desirable SAW device responses, and to perform numerous other useful functions.

A few useful MSC configurations found in the open literature are illustrated here for reference. First, FIG. 1 shows a SAW device 100 with a straight MSC 102 that is placed between an apodized transducer 104 in a first (upper) acoustic track (apodization referring to the spatially varying overlap lengths between electrodes of opposite polarities) and an unapodized transducer 106 in a second (lower) acoustic track. Voltages produced by the SAW in the upper track are intercepted by the MSC and are transferred to and spread uniformly across the lower track, generating a corresponding surface wave in the lower track. If the number of strips in the MSC is selected properly, the SAW launched to the right by the apodized transducer will be coupled over to the lower acoustic track with 100% efficiency. Bulk waves propagating in the upper acoustic track will continue to propagate in a straight line, unaffected by the MSC, and any interference they may have caused will be eliminated. Also, the MSC effectively spreads the acoustic energy from the apodized transducer over a uniform, full aperture when launching the wave towards the second transducer. Thus, it is well known in the art that a MSC can be used between two apodized transducers that would not normally be cascaded in-line in a single acoustic track. By adjusting the number of strips, the amount of energy that is transferred from the upper to the lower track can be adjusted. Different numbers of strips are required to effect a given % energy transfer between tracks on different substrates as well, based on the electromechanical coupling coefficients of the materials involved. The phase shift experienced by the SAW being transferred is also dependent on the number of strips and substrate material, in a manner that makes the phase shift between tracks related to the percent of energy transferred. For 100% transfer, the SAW generated in the lower track will have a 180° phase shift relative to the SAW in the upper track, while for 50% energy transfer, the phase shift between tracks is 90°.

There can be variations of the straight MSC, including phase offsets introduced by jogging (or offsetting) the lines in different acoustic tracks, transferring from one track into more than one track (of the same or different acoustic apertures), and others. FIG. 2 shows a modified version of the straight MSC wherein the center region of the MSC is splayed out. This region corresponds to the portion of the substrate between the acoustic tracks. Angling of the MSC traces in this region prevents acoustic waves from being launched in a direction collinear with the propagating acoustic waves in the upper and lower acoustic tracks in this unused region. Any launched waves would instead be launched off-angle.

A second known MSC structure that is useful is the U-shaped MSC. This structure can be thought of as what would result if a straight MSC was stretched and bent around so that two ends aligned, as shown in FIG. 3. The original straight MSC is a track changing MSC of known efficiency, so the SAW that would have been launched to the right in the lower track is now launched to the left in the U-shaped MSC. The spacing in the center of the two arms of the "U" is chosen to ensure that 100% of the signal is reflected to the left of the U shaped MSC. This structure produces a broadband reflector that effectively reflects 100% of a SAW incident from the left as if there was an ideal acoustic mirror in the space between the two arms of the U.

An alternate ring-shaped MSC reflector structure has certain benefits, discussed by Brown in "Low-Loss Device Using Multistrip Coupler Ring Configuration with Ripple Cancellation," *IEEE Ultrasonics Symposium*, 1986, pp. 71-76. Considering the bottom traces of the U-shaped MSC shown above, the curved regions of the traces correspond to portions of the MSC that do not contribute to the production of SAWS the desired acoustic track. Thus, the shorter these regions the better, but lithographic requirements necessitate a minimum separation space between adjacent traces, increasing size. In addition, since the spacing of the electrodes will be on the order of 40% of an acoustic wavelength for the SAW of interest, when a SAW passes under the MSC and the first electrode is near maximum SAW voltage, the adjacent electrode will be near a minimum voltage. Adjacent electrodes at alternating polarities will introduce considerable inter-trace capacitance, which will alter the performance of the MSC. An alternative ring-shaped MSC reflector is shown in FIG. 4, where the curved (or in this case segmented line) trace sections that connect two traces on either side of the U are alternated so that every other curved section is on the opposite end of the MSC. This Changes the "U" shape to a ring, and ensures that most of the curved segments at the top are one polarity while most at the bottom are the other polarity, substantially reducing the inter-trace capacitance introduced by these sections of the traces. "Most" is used in this description, since the non-synchronous nature of the trace spacings relative to the SAW wavelength means that the polarity within each end (top and bottom) will slowly vary within that region. But the improvement in performance is significant.

SAW sensors incorporating dispersive elements: Dispersive elements such as chirp transducers have long been used in SAW signal processing devices such as radar expander/compressor pairs. These elements have also been used in SAW sensors, as discussed in U.S. Pat. No. 8,441,168, entitled SAW Sensor tags with enhanced performance. Chirp elements enable realization of processing gain, which can be effected on the SAW die, or can be distributed to different portions of the system. Pulse compression occurs when an upchirp signal is convolved with a downchirp (or vice versa). Alternate frequency coded pulses can also be used to produce pulse compression. Chirp pulse compression takes a signal that contains frequency components from $F_{low}$ to $F_{high}$ (i.e., with a bandwidth $B=F_{high}-F_{low}$) within a time length T, and by convolving it with a device with the opposite chirp slope (i.e., if the input signal is an upchirp the compression filter is a downchirp and vice versa), transforms the signal in to a narrow pulse of duration $t \approx 1/B$ with voltage amplitude increased by sqrt(BT). In SAW devices, it is quite easy to realize BT products of 50, 100, 200, or even more, which can produce significant processing gain.

SAW Sensor-tags: SAW devices have been used as wireless interface devices to external voltage producing or impedance varying sensors, as discussed in U.S. Pat. No. 8,441,168, entitled SAW Sensor tags with enhanced performance. SAW sensor-tag interface devices enable the wireless reading of (batteryless or passive) sensors that normally are operated in powered, wired systems. SAW wireless interface devices, which can be individually identifiable, or RFID-enabled, are referred to as SAW sensor-tags or SAW sensor-tag wireless interface devices. Brocato, in "Passive Wireless Sensor Tags," Sandia Report SAND2006-1288, Sandia National Laboratories, Albuquerque, N. Mex. 87185, March 2006, demonstrated that a SAW differential delay line could be used, with a sensor that changes impedance with measured quantity attached electrically in parallel with a reflector in one of the paths, to measure variations in the attached sensor. Other researchers have also demonstrated similar devices, including those described by Reindl et al. in "Theory and Application of Passive SAW Radio Transponders as Sensors," *IEEE Transactions on Ultrasonics, Ferroelectrics, and Frequency Control*, Vol. 45, No 5, September 1998. pp. 1281-1292, Scholl et al in "Wireless Passive SAW Sensor Systems for Industrial and Domestic Applications," *Proceedings of the* 1998 *IEEE International Frequency Control Symposium*, p. 595-601, and Schimeita et al in "A Wireless Pressure-Measurement System Using a SAW Hybrid Sensor," *IEEE Transactions on Microwave Theory and Technique*, Vol. 48, No. 12, December 2000, pp. 2730-2733.

More recently, a range of RFID enabled, dispersive, half-dispersive, and non-dispersive SAW wireless interface devices have been demonstrated that can be used to read a wide range of external sensors and devices, including switches, RTDs, thermistors, strain gauges, and acoustic emission sensors. Methods have been shown for adapting SAW sensors to operate with external sensors with impedances (Z) having real parts Re(Z) varying from low (~20Ω) resistance to moderately high (over 5 kΩ) resistance, the latter being devices that normally would not interface well with SAW devices. This work is described in the final report for NASA SBIR Phase I contract NNX09CE49P (Jul. 22, 2009). For voltage generating external sensors (such as AE sensors, thermocouples, etc.), the external sensor voltage is applied as the gate voltage on a zero-bias (normally ON) field effect transistor (FET).

SUMMARY OF THE INVENTION

The present invention provides for SAW sensor and sensor-tag device embodiments that exhibit lower loss and/or enhanced time diversity performance relative to conventional systems. Antennas suitable for efficient operation its conductive media are provided. Sensors that can measure electric current and scaled voltage (through measurement of the magnetic field and electric field, respectively) are also disclosed.

Low-loss differential delay line SAW sensors using MSC elements: Conventional SAW differential delay line sensors often utilize SAW transducer and reflector elements and die layouts that result in loss mechanisms that include bidirectional loss from the transducers, inefficiency in reflector operation, and power division loss due to multiple acoustic tracks. All of these factors tend to reduce the signal strength of each reflected sensor response relative to the input signal strength. This negatively impacts the signal to noise ratio (S/N) and reduces the wireless range over which such devices can be read using a given radio and set of antennas. Higher loss can also negatively impact the accuracy of measurements produced by the sensor and sensor-tag devices, for a given radio interrogation system. The present invention teaches the use of MSC elements in novel device embodiments that produce devices with lower loss relative to conventional devices.

Low-loss differential delay line SAW sensors with enhanced time diversity: Time diversity is a property of sets of SAW sensors and tags that provides for each device to respond within a separate, distinct time range when the set of devices is activated by a common radio frequency (RF) interrogation pulse. The present invention teaches SAW sensor and sensor-tag device embodiments that incorporate dispersive and/or MSC elements to produce responses that are shorter in time and lower loss than conventional devices capable of producing an equivalent number of separately detectable responses. These properties enable construction of sets of passive wireless sensors have more time diversity within a given total time length, enabling production of sensor systems with more sensor or sensor-tag devices simultaneously operable without inter-device interference. The lower loss of devices according to the present invention either increases the wireless range with which the devices can be read, or improves the accuracy of measurements produced by each device, or a combination of both.

Inductive coupling and resonant magnetic coupling for remote reading of SAW sensors: Most conventional wireless SAW sensors have been activated via conventional radiative antennas, which interact via propagating, time varying electromagnetic signals. Such antennas do not function properly when mounted on metal surfaces, or when immersed in conductive media. Some SAW devices for use in liquids have been demonstrated that use inductive coupling to activate the SAW device wirelessly at short range (up to a cm or two). The present invention teaches the use of resonant magnetic antennas for remote activation and reading of SAW sensors and sensor-tags, over longer-range, in highly metallic environments, and/or when immersed in conductive media.

Wireless measurement of current and voltage: The present invention teaches devices, apparatuses, systems, and methods involving the use of field probes with FETs and SAW sensor-tag wireless interface devices to measure voltage and current in current carrying conductors (CCCs) via measurement of the electric fields and magnetic fields around said CCCs. The present invention also teaches devices, apparatuses, systems, and methods for determining the relative phase (leading or lagging) of the current and voltage in AC power systems, thereby providing the information necessary to determine power factor. Such information is useful, for example, in monitoring the condition of the power distribution grid.

Aspects of the present disclosure include an apparatus for wirelessly measuring the strength of electric and/or magnetic fields. The apparatus including one or more acoustic wave sensor or sensor-tag devices, at least one transistor, at least one field probe operable to interact with the held being measured and produce a voltage, and one or more antennas.

Further aspects of the present disclosure include a surface acoustic wave Sensor tag device. The devices includes a piezoelectric substrate, at least one first transducer arranged on at least a portion of said piezoelectric substrate, and at least one second surface acoustic wave element formed on said piezoelectric substrate and spaced from said transducer along the direction of acoustic wave propagation, wherein said at least one second surface acoustic wave element includes at least one multistrip coupler (MSC).

Additional aspects of the present disclosure include an antenna for remote activation and read of SAW sensors. The antenna includes at least one pair of magnetic coupling elements operable to create a magnetic resonance therebetween, wherein said at least one pair of magnetic coupling elements can transfer energy and data to and from SAW devices immersed in conductive materials.

Still other aspects, features, and advantages of the present invention are apparent from the following detailed description, simply by illustrating exemplary embodiments and implementations, including the best mode contemplated for carrying out the present invention. The present invention also is capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The present invention will be understood more fully from the detailed description given below and from the accompanying figures and drawings of various embodiments of the invention, which, however, should not be taken to limit the invention to the specific embodiments, but are for explanation and understanding only.

DETAILED DESCRIPTION OF THE INVENTION

Embodiments of the present invention teach devices, apparatuses, systems, and methods for effectively increasing the signal strength (i.e., reducing the loss) and/or providing enhanced time diversity performance of SAW sensor and sensor-tag devices relative to conventional devices. Antennas suitable for efficient operation in conductive media are disclosed. Sensors that can measure current and scaled voltage (through measurement of the magnetic field and electric field, respectively) are also disclosed.

Figure 1:
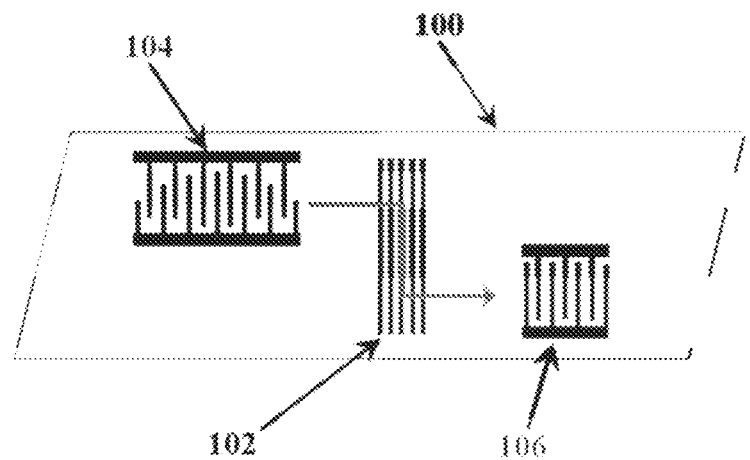
FIG. 1 shows a schematic representation of a conventional SAW device incorporating a straight track-changing MSC.
Figure 2:
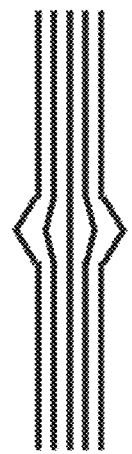
FIG. 2 shows a schematic representation of a modified straight MSC that has a center region (between the acoustic tracks) where the traces have been angled to prevent acoustic waves from being launched collinear to the waves hi the upper and lower acoustic tracks.
Figure 3:
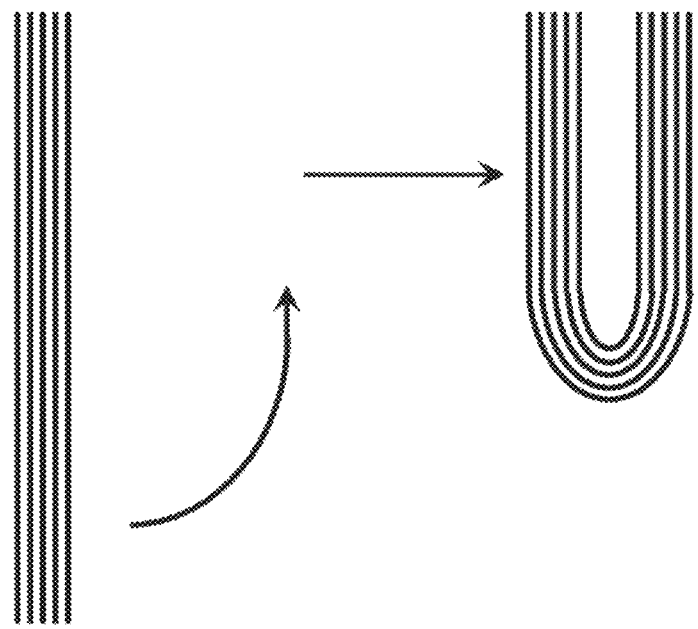
FIG. 3 shows a straight MSC being bent to produce a conventional U-shaped MSC.
Figure 4:
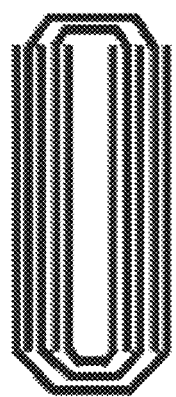
FIG. 4 shows a conventional ring shaped MSC.
Figure 5:
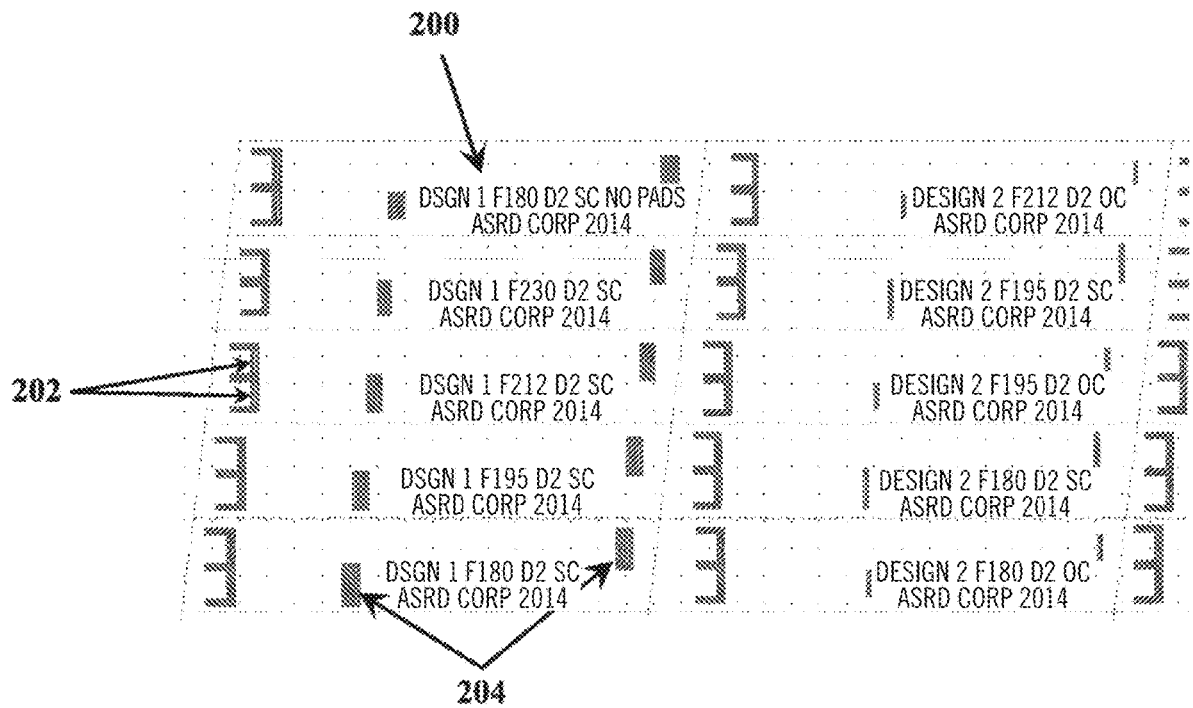
FIG. 5 shows a partial view of a photomask layout for a set of differential delay line SAW sensors that utilize conventional SAW transducer and reflector elements.

Low-loss differential delay line SAW sensors using MSC elements: Conventional SAW differential delay line sensors utilize bidirectional transducers with ordinary reflectors that are either short circuited or open circuited transducers or arrays of electrodes. The partial mask layout shown in FIG. 5 illustrates and array of devices (or die) such as the one labeled 200, each with two input transducers 202 (on the left end of each die) that are electrically fed in parallel, and two ordinary reflectors located 204 at different distances and hence at different acoustic delays to the right. SC and OC in the labels on each die indicate short circuit and open circuit reflectors, respectively. These devices suffer from loss mechanisms that include bidirectional loss from the transducers and inefficiency in reflector operation. In addition, feeding two transducers in parallel causes a power division 'loss', reducing the signal strength in each acoustic path relative to the input signal strength. Unidirectional transducers can be used to reduce the bidirectional loss, as they send and receive acoustic waves in only one direction.

Selected disclosed apparatuses, devices, systems, and methods use ring-shaped MSC reflectors such as those described above to provide reflectors that are nearly 100% efficient, significantly reducing the losses due to inefficient reflectors. An added benefit of using these reflectors is that the reflected SAW response is not broadened in time by the reflector as would be the case with a normal reflector. The reflected response appears as if it were reflected from a nearly ideal mirror located at the center of the ring MSC reflector. This is beneficial for SAW sensors utilizing time diversity as one factor in device identification. Some device embodiments are provided below.

Figure 6:
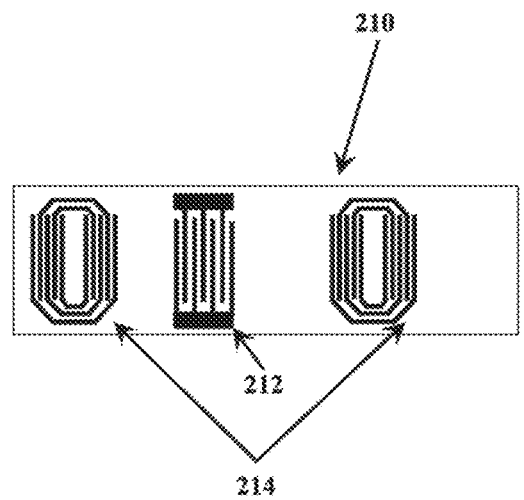
FIG. 6 shows a schematic representation of a low-loss SAW differential delay line sensor incorporating ring type MSCs according to aspects of the present disclosure.

The first embodiment, shown schematically in FIG. 6, is a simple differential delay line using a bidirectional transducer and two ring MSG reflectors located on either side. The SAW device 210 includes a transducer 212 located between two ring MSC reflectors 214, which are located at different distances from the transducer. When impulsed, this device will produce two responses at different delays, determined by the round trip spacing between the transducer and each reflector and the acoustic wave velocity. Clearly, this structure can be modified in a number of ways to make useful sensors. The delays can be adjusted to produce two closely spaced responses that produce a bandpass response with one or more notches in the passband. Alternately, films or other surface treatments can be introduced onto portions of the propagation path on one or more regions of the surface to produce sensors suitable for detection of chemical, biological, or other analytes. Physical die mounting and packaging techniques and other methods can also be used to adapt such a device to use as a physical sensor for an assortment of parameters. Construction of a device with multiple acoustic tracks, each containing a differential delay line such as that shown above, can produce sensors capable of making multiple measurements that are useful for many purposes. Addition of multiple transducers in the acoustic track (or tracks) can provide a means a connecting external sensors to the SAW die, providing a wireless interface device to said external sensor or sensors, while also potentially providing one or more SAW sensor measurements. This type of structure can be useful for measurement of multiple parameters, such as temperature (measured by the SAW die) and strain (measured by an external strain gauge and read through the SAW response or measured by the SAW die), voltage (measured by the SAW die or measured using a FET external to the SAW and read through the SAW die) and/or acceleration (read through the SAW as a wireless interface device). Various diversity techniques can be incorporated in these devices, including coding such as chirp/dispersive coding, direct sequence spread spectrum (DSSS) coding, and other known techniques.

Figure 7:
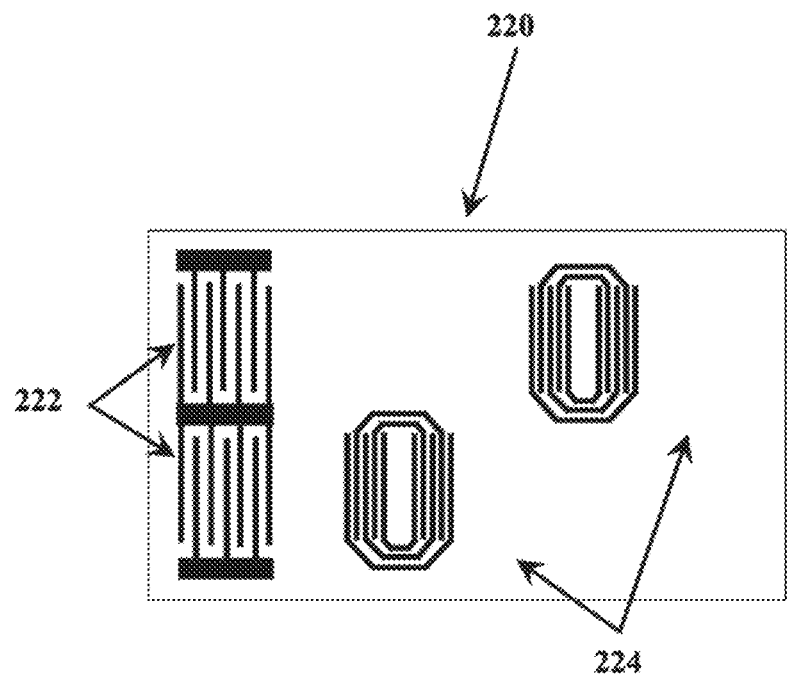
FIG. 7 shows a schematic representation of another embodiment of a low-loss SAW differential delay line sensor incorporating ring type MSCs and more than one acoustic track according to aspects of the present disclosure.

Another embodiment is shown in FIG. 7, where a two acoustic track device 220 with two transducers 222 on the left (which can be unidirectional transducers) launch SAWs towards two ring MSC reflectors 224, which are located at different acoustic delays on the surface. Acoustic waves launched by the transducers propagate to the right on the die and are reflected back at time delays determined by the spacing of the SAW elements on the die surface, and the acoustic wave velocity. The transducers are shown sharing a common bus bar, but this is not required for device construction and operation. This can be extended to mulitple tracks beyond two, and used with additional SAW elements such as transducers that can be connected to external sensors, or with ordinary reflectors that are partially reflective, to allow multiple responses from the region on one side of a transducer in one acoustic track. With multiple transducers in one acoustic track, these devices can be used in reflective mode, where the S11 response of the device is measured through one port attached to an antenna, or in a reflective transmission mode where the S21 response through two or more transducers attached to the same antenna is measured. For clarity, if the two (or more) input transducers are formed with busbars that are independent, one of these transducers can be used as the interface to the external sensor. Alternatively, other transducers can be added to serve this purpose.

Figure 8:
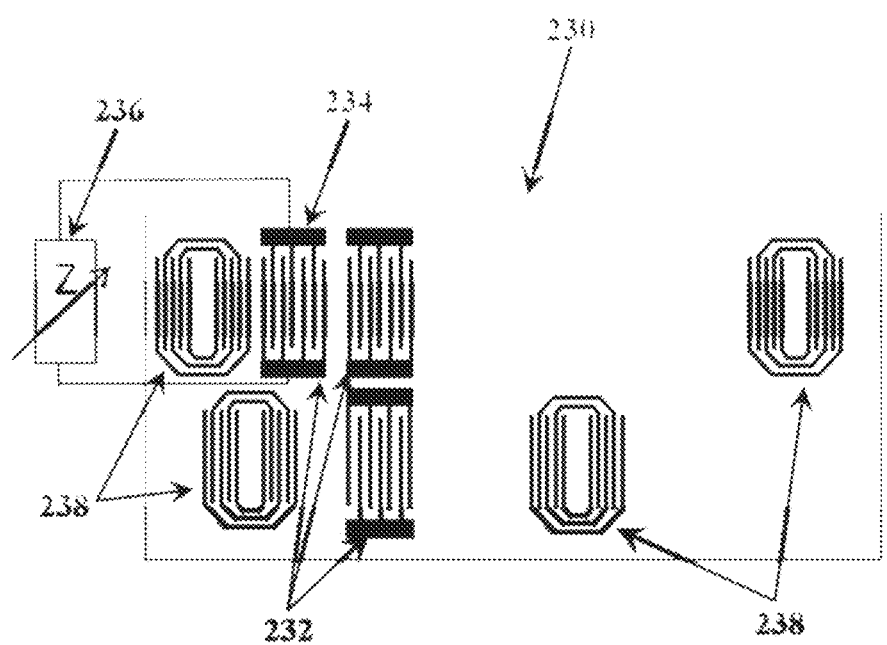
FIG. 8 shows a schematic representation of an embodiment of a two acoustic track low-loss SAW differential delay line combined sensor and sensor-tag device incorporating both ring type MSCs and external impedance varying device(s) according to aspects of the present disclosure.

FIG. 8 shows just one example of a sensor-tag embodiment, where one transducer has been attached to an external impedance varying load. Voltage producing external sensors and other devices can also be read using a FET as an Interface device (see current and voltage sensing section below). In FIG. 8, SAW device 230 includes three transducers 232, one of which 234 is connected to an external impedance varying load 236, and multiple (in this example four) U-shaped MSCs 238.

Figure 9:
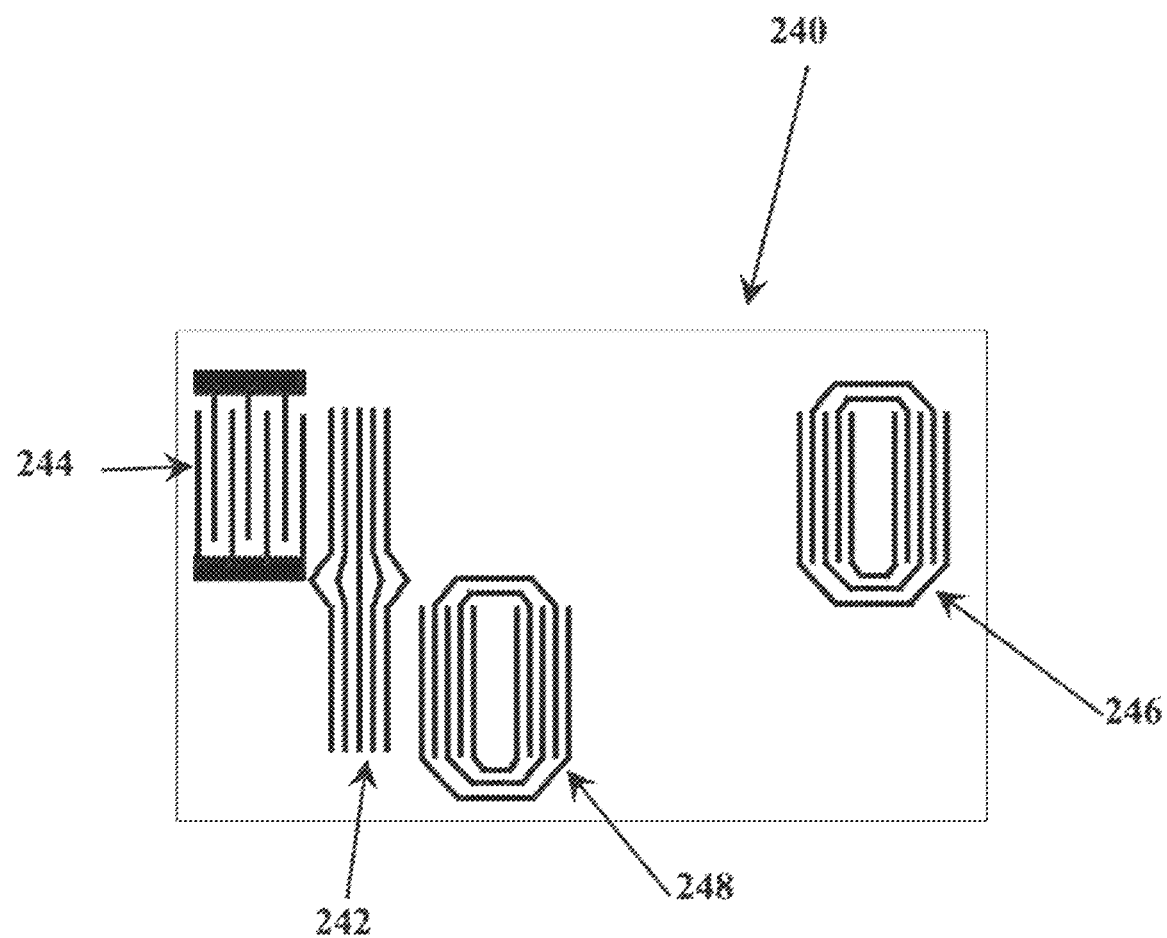
FIG. 9 shows a schematic representation of a low-loss SAW differential delay line sensor embodiment incorporating track changing MSCs and ring type MSCs according to aspects of the present disclosure.

Another MSC element is the track changing MSC. A simple SAW differential delay line sensor embodiment 240 that incorporates a track changing MSC element 242 is shown in FIG. 9. In the configuration shown, one would normally construct the MSC 242 to be a 50% track changing coupler, so that half the acoustic energy propagating to the right in the upper track from transducer 244 continues on to the far MSC ring reflector 246, while the other 50% changes to the lower track, where it reflects from the closer MSC ring reflector 248. This type of track changing structure can be used on one side of a bidirectional transducer, or a two-sided device can be constructed with track changing MSCs on one or both sides. Other variations, such as track changing MSCs with unequal acoustic apertures, devices with more than two acoustic tracks, and track changing MSCs with delay offsets and/or subharmonic or harmonic spreading of the MSC traces are beneficial for certain purposes.

Figure 10:
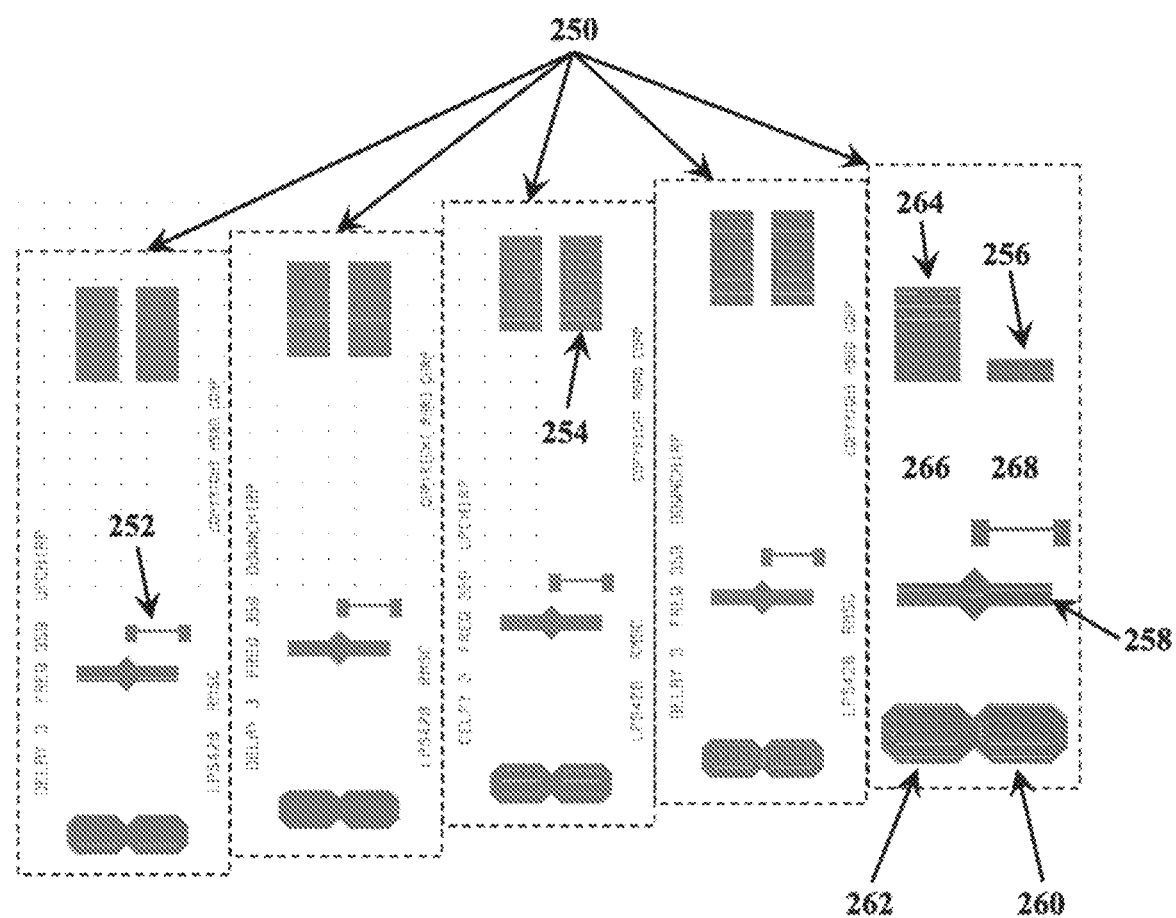
FIG. 10 shows a schematic representation of a low-loss SAW differential delay line SAW sensor embodiment according to aspects of the present disclosure.

FIG. 10 shows a schematic representation of a low-loss SAW differential delay line SAW sensor that incorporates both track changing MSCs and ring shape MSCs, in addition to transducers and reflectors of various kinds, resulting in folded acoustic tracks that have longer acoustic delays for some of the reflective SAW responses than would otherwise be possible for a SAW die of a given size using conventional devices. Specifically, FIG. 10 shows five individual SAW die 250. On each die a single transducer 252 acts as an input/output (I/O) transducer, launching acoustic waves upward and downward. The upward propagating wave is reflected the reflector 254 at the upper right of the device (in this example, an apodized reflector with open circuited electrodes, although another die shows an unapodized reflector 256). This reflected response returns to the launching transducer, providing a first response. The acoustic wave launched downward propagates to the MSC 258 below, which is a 50% track changing MSC. Half of this signal passes downward through the right of the MSC 258, and reflects off the ring-shaped MSC reflector 260 at the bottom right. This reflected response is then effectively shunted to the left by the track changing MSC 258, as the portion that would pass through in an upward direction on the right is cancelled but an out of phase contribution from the signal reflected off the ring-shaped MSC reflector 262 on the left. The 50% of the initial signal that is shunted to the left track 266 is launched downwards with a 90° phase shift relative to the wave in the right track 268. This propagates down, is reflected off the lower ring reflector, and returns to the track changing MSC. The relative phases of the waves result in no upward propagating wave in the right track, with all of the propagating energy going upward in the left track. It is reflected from the reflector at the top left 264 (again in this example an apodized reflector), and returns downward. This wave goes through another pass of being track changed, reflected by the ring MSC reflectors 260 and 262 at the bottom, and is finally recombined in the right track, heading upwards towards the I/O transducer where it creates a second response. This device embodiment provides the ability to significantly increase the differential delay in a sensor device for a given die size, as the second response occurs after the wave propagates from the I/O transducer to the lower ring MSC reflectors, back to the top of the die, back to the ring MSC reflectors, and back up to the I/O transducer. Thus the overall delay of the second reflection corresponds to almost three times the distance between the bottom and top reflectors—a significant increase relative to simple differential delay line structures shown in FIGS. 6 through 9. As sensor sensitivity for a differential delay line (excluding notch devices) depends, in part, on the differential delay—with longer delays producing sensors with greater sensitivity, the ability to 'fold' the acoustic response on the die surface (using this or other known MSC structures) can produce sensors with improved response sensitivity. Finally, the fact that this structure requires only one transducer as an input/output transducer means that there is no power division loss as would occur when two or more transducers are electrically connected in parallel. This reduces sensor loss further. With proper design, this embodiment (among others described in the present disclosure) can be designed to produce multiple transit responses from the near reflector 256 that occur at relatively short delays, providing three or more different delay responses that can be used to eliminate phase ambiguity and enhance precision of measurements extracted from the sensor or sensor-tag devices.

Figure 11:
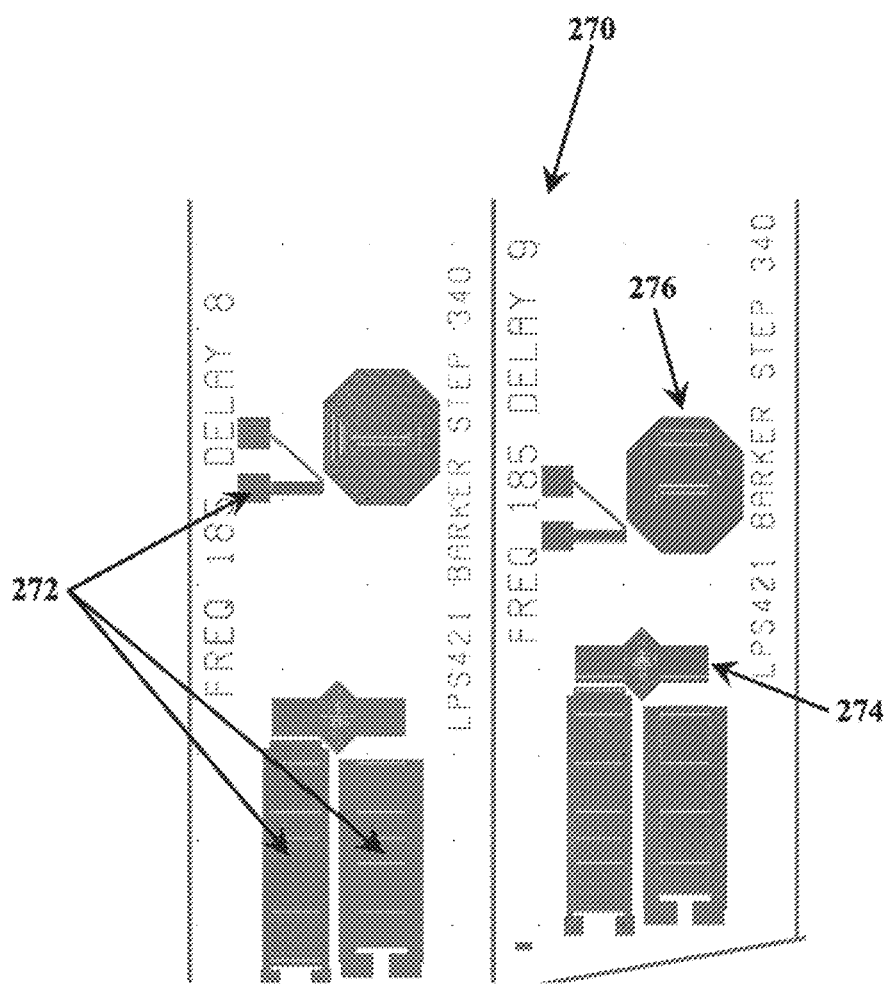
FIG. 11 shows another schematic representation of a low loss SAW differential delay line sensor embodiment according to aspects of the present disclosure.

FIG. 11 shows another schematic representation of a low-loss SAW differential delay line sensor that incorporates multiple transducers, making it useful either as a SAW sensor or a SAW sensor-tag wireless interface device that can be used to read external devices connected to one or more of said transducers, or as a combined device where selected measurements are made by the SAW device itself while other measurements are made by external devices and wirelessly read through the SAW device as an interface. Specifically, this device 270 includes three transducers 272, a track changing MSC 274, and a ring-shaped MSC reflector 276. This device 270 can be used as a sensor-tag, with one or more of the transducers attached to external sensors and other components (such as impedance transforming components and FETs) to produce acoustic responses that depend on the external device measurements.

Figure 12A:
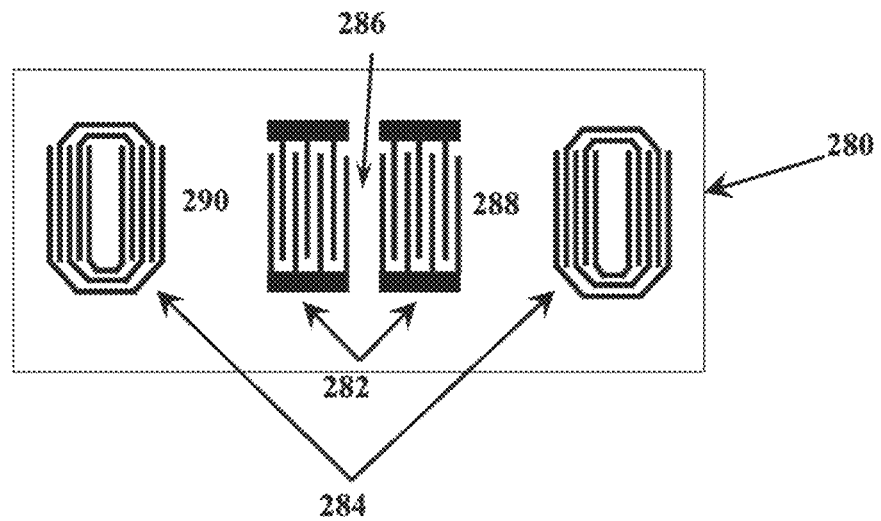
FIG. 12A shows a schematic representation of an additional SAW device according to aspects of the present disclosure.
Figure 12B:
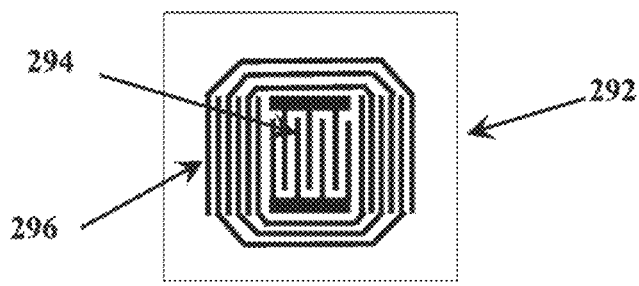
FIG. 12B shows a schematic representation of an additional SAW device according to aspects of the present disclosure.
Figure 12C:
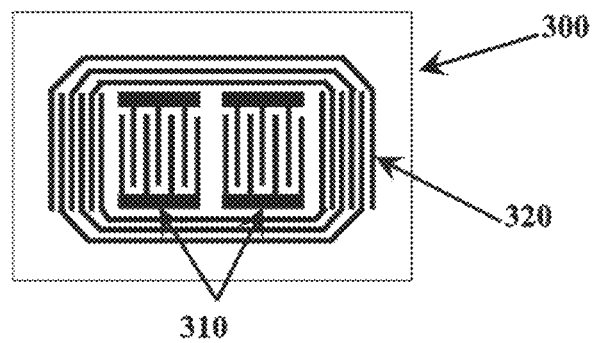
FIG. 12C shows a schematic representation of an additional SAW device according to aspects of the present disclosure.

FIGS. 12A-12C show schematic representations of three additional device embodiments according to aspects of the present invention. Referring to FIG. 12A, SAW differential delay line device 280 includes two or more transducers 282 in one acoustic track, and two or more reflectors, shown as ring reflectors 284. This device 280 can be used in a transmission mode, where the transducers 282 are connected electrically in in parallel to a common antenna, and the reflected response is the combination of the S21 and S12 transmission responses. Alternatively, one transducer can be used as an I/O transducer, and the other transducer can be used as a reflector or interface to an external impedance varying or voltage producing device. The spacings 286 (between the two transducers), and 288 and 290 (between the transducers and the reflectors) can be varied to produce devices with a range of performance properties. The acoustic delay corresponding to spacing 286 determines the time at which the first transmission response occurs, and the times at which multiple transits of this response occur. Acoustic delays due to spacings 288 and 290 can be equal, slightly unequal, or very unequal. Equal spacings 288 and 290 would produce reflections that add in phase at the output. Due to multiple transit effects, this device 280 would still produce multiple responses, which can be useful. Slightly different spacings 288 and 290 will produce two responses slightly offset in time, which can result in a combined frequency domain response that has a power spectral density (PSD) with one or more notches.

Referring to FIG. 12B, SAW device 292 consists of a single transducer 294 within the center region of a ring-shaped MSC 296. Referring to FIG. 12C, SAW device 300 includes two or more transducers 310 within a ring-shaped MSC 320. Both devices 292 and 300 function as resonant devices, one-port and two-port respectively. Added spacing between the transducers 310 in device 300 can be used to add an initial acoustic delay to the device response. Such a resonant or tinging response with an added initial acoustic delay can also be implemented using two transducers between two efficient reflectors (such as ring-shaped MSCs) on either side of two transducers, similar to FIG. 6 with two transducers rather than one. Additional embodiments can include more than two transducers.

This is just a small subset of possible device embodiments, as this approach can be extended to include multiple acoustic tracks, single sided die with UDTs or double sided die (on one or more tracks), and many other configurations that incorporate alternative MSC structures (fanned MSCs, J-shaped MSCs, interleaved U-shaped MSCs, and many others). Within the scope of the present disclosure, any of these embodiments can also include additional transducers in various locations on the surface, which can be used as interfaces to external impedance varying or voltage producing sensors, to produce wireless interface devices (or sensor-tags). Other embodiments within the scope of the present disclosure can include additional reflectors and MSC elements, multiple acoustic tracks, and transducers, or combinations thereof. The resulting devices can be used as SAW sensors, where all measurements are made directly by the SAW die. Alternatively, the resulting devices can serve as sensor-tags, as wireless interface devices to external measurement devices that have varying impedance or produce voltages in response to changes in measured parameters. Or, the resulting devices can be hybrid devices, where selected measurements are made directly by the SAW die and other measurements are made by external devices and read wirelessly through the sensor-tag device to which the external devices are connected.

Low-loss differential delay line SAW sensors with enhanced time diversity: Much recent work has focused on developing sets of passive wireless sensors that are non-interfering, so that calibrated measurements can be taken from sets of sensors that are operating simultaneously in the field of view of a transceiver. Time diversity, frequency diversity, code diversity, and/or chirp diversity have been used in combinations that make devices both individually identifiable and non-interacting. Depending on the bandwidth that is available in a given application environment, these diversity techniques can be combined in a manner appropriate to achieve sets of sensors that work together well. One way to enhance the time diversity capacity of a sensor set is to shrink the time length of each SAW sensor response pulse, since pulses that are confined within a narrow time range allow more of said pulses to fit within a given time range. However, for conventional finite impulse response (FIR) SAW filters, the time length of a transducer is inversely related to its bandwidth—meaning that very short transducers are broadband—which reduces the capacity for frequency diversity. Additionally, very broadband signals may not fit within allowed FCC frequency ranges for radio frequency (RF) electronic transmissions (such as in the ISM band). Also, there is another tradeoff when using very short transducers—each additional electrode overlap couples more energy into the SAW substrate. So using very short transducers can reduce the overall efficiency of electromechanical coupling, increasing device loss. Thus, physics limits the tradeoffs that can be made when trying to realize diversity schemes for conventional SAW structures.

Figure 13:
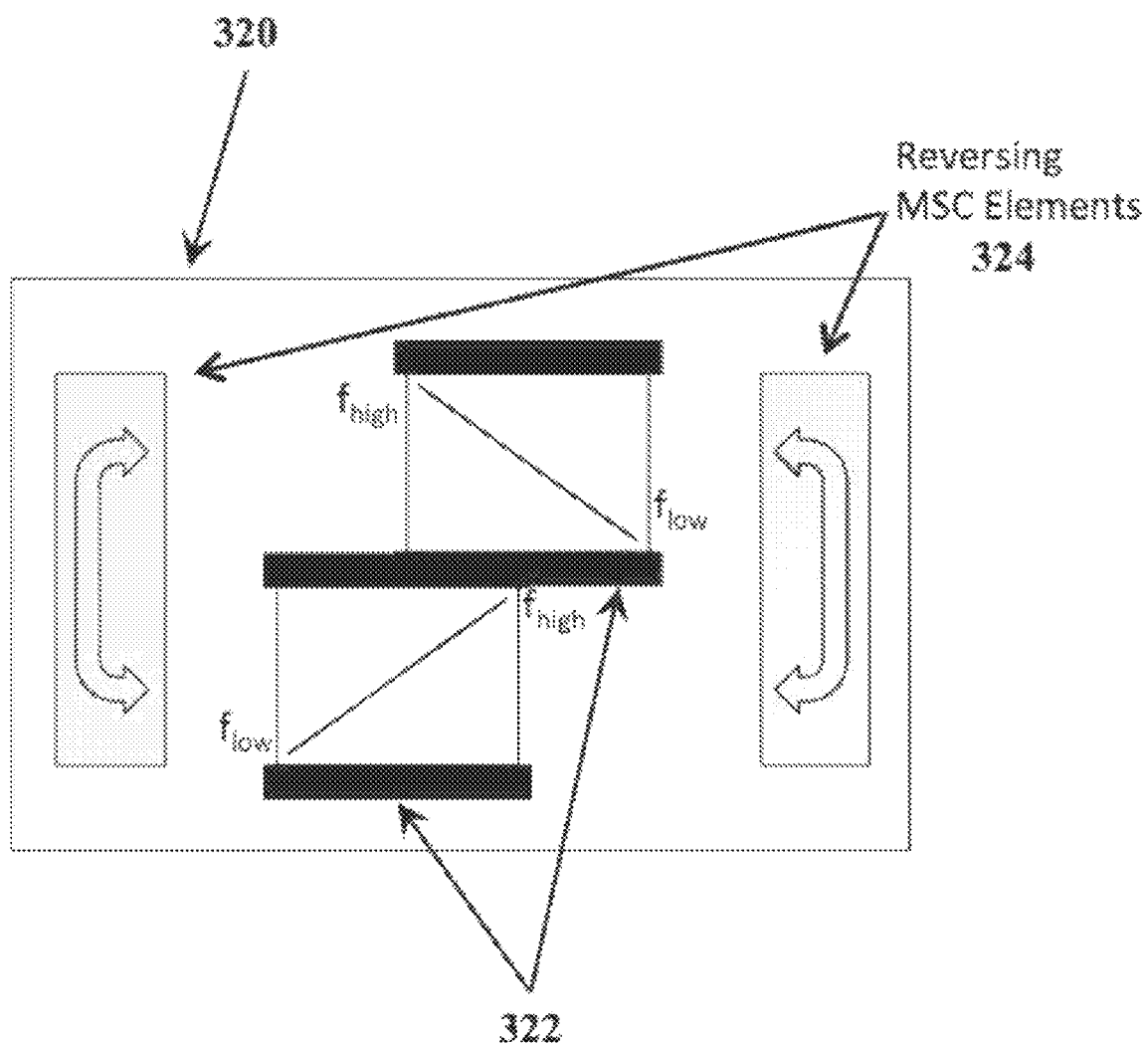
FIG. 13 shows a schematic representation of a low-loss SAW device with dispersive elements and track changing MSC reflectors that uses pulse compression according to aspects of the present disclosure.

The devices disclosed herein, by comparison, take advantage of the time compression and signal processing gain introduced by pulse compression to produce SAW responses that are very narrow in time and simultaneously have significantly increased signal levels—improving both time diversity and reducing loss. FIG. 13 shows one SAW differential delay line device 320 according to aspects of the present disclosure. In this device 320, two transducers 322 with opposite chirp slopes are positioned in two acoustic tracks. On each end are located reversing MSC elements 324 that both track change with 100% efficiency and also change the direction of the reflected wave. When the two transducers 322 are electrically connected in parallel, acoustic waves are simultaneously launched to the left and right in both the upper and lower acoustic tracks. The signal launched to the left in the upper acoustic track, which is a downchirp (the high frequency comes first and the low frequency later) is coupled down to the bottom acoustic track, where it then is effectively reversed, propagating to the right. When received by the transducer in the lower track (an upchirp—which has the low frequency first and the high frequency later), there is very little output signal until the chirp signal is fully in the transducer, at which point a strong convolution response peak (compressed pulse) is generated. Coincidentally, the wave launched to the left in the lower track is an upchirp. This is reflected, reversed, into the upper track where it is compressed by the downchirp in the upper transducer. The two compressed pulses from the two propagation paths on the left occur simultaneously and add. A similar process involving the acoustic waves launched to the right in the upper and lower acoustic tracks produces a second compressed pulse from the acoustic propagation path and reflector on the right.

Thus, with the transducers fed in parallel by an antenna, as is conventional for SAW sensors, any activating signal will generate signals in the upper and lower tracks, which are counter-propagating, and recombine in transducers to produce a pair of output compressed pulses that have significantly stronger signal strength than the input signal, and also are very short in time. As previously discussed, SAW devices with high BT products can transform fairly long duration signals into pulses that are much narrower in time. Pulse compression can produce pulses of duration $t \approx 1/B$ with voltage amplitude increased by sqrt(BT). By way of example, a BT of 100 can be implemented in a SAW transducer that is 2 microseconds long with a bandwidth of 50 MHz, among other combinations. This BT will generate a compressed pulse that is 20 nsec wide, with an amplitude that is 10 times larger than the original signal—introducing 20 dB of processing gain while reducing the time extent by a factor of 50.

Groups of sensors designed to operate as differential delay lines can be designed with response pulses interleaved in time, with individual sensor responses extracted through proper time domain windowing in addition to windowing in frequency and convolving with coding if frequency and code diversity are also used). Inclusion of frequency diversity and/or code diversity can increase the total sensor set size possible or a given bandwidth and degree of time diversity.

The transducers 322 can be offset relative to one another (let to right) as shown, or vertically aligned. Also, the transducer pair can be positioned centrally, so that reflections from both sides arrive back at the transducers at the same time producing one large output pulse, or the pair of transducers 322 can be offset to one side or the other. If the transducers 322 are aligned vertically, and offset to one side of center, this produces differential delay line that produces two strong output pulses at different times. A similar differential delay line response occurs when the transducers are not aligned vertically (i.e., they are offset left to right relative to one another) independent of their placement between the two reversing MSC elements, and/or when they aligned vertically and are off-center relative to the two reversing MSC elements.

Figure 14:
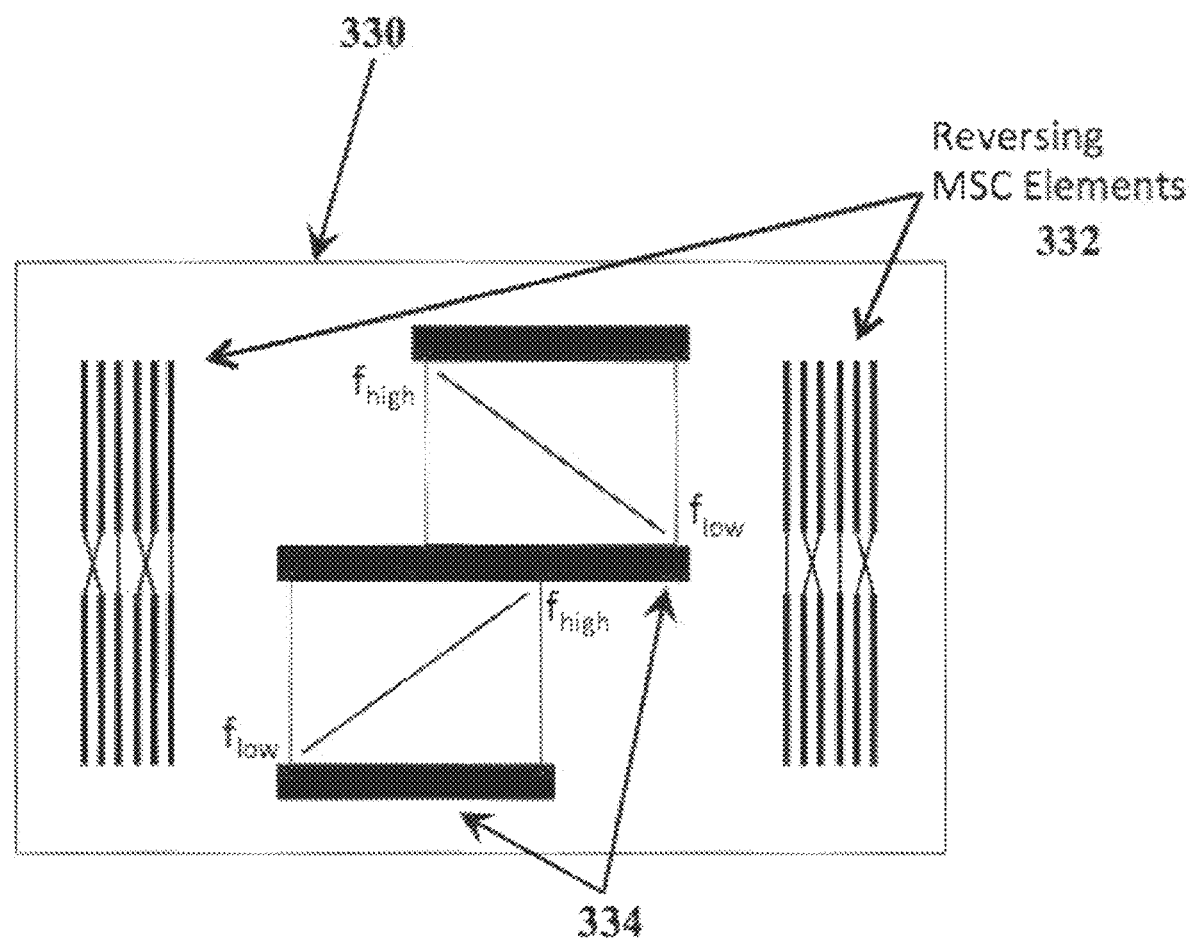
FIG. 14 shows a schematic representation of a low-loss differential delay line SAW sensor with dispersive elements and track changing reflective MSC elements that uses pulse compression according to aspects of the present disclosure.

One example of a track changing, 100% reflective MSC is that shown by Danicki in "Theory of Surface Acoustic Wave Reversing Multistrip Coupler," *Archives of Acoustics*, January 1994, pp. 227-238. FIG. 14 shows a schematic representation of a low-loss differential delay line SAW sensor 330 according to aspects of the present disclosure that incorporates this structure. The sensor 330 also includes chirp transducers 334 with chirp senses as shown, or equivalently the two chirps shown could both be mirrored left to right, or they could be swapped between upper and lower acoustic tracks, all with nominally identical results. For any of these configurations, the overall operation of this embodiment is as described for the device 320 in FIG. 13. In the reflective track changing reversing MSC elements 332, the MSC strips are spaced so they are 120° apart, so that swapping two of every three traces as shown reverses the direction of acoustic wave propagation in the second track relative to the wave propagation in the first track. (It should be noted that close attention should be paid to MSC line spacing to ensure that the lines are not synchronous, which would produce reflections of the acoustic wave).

Figure 15:
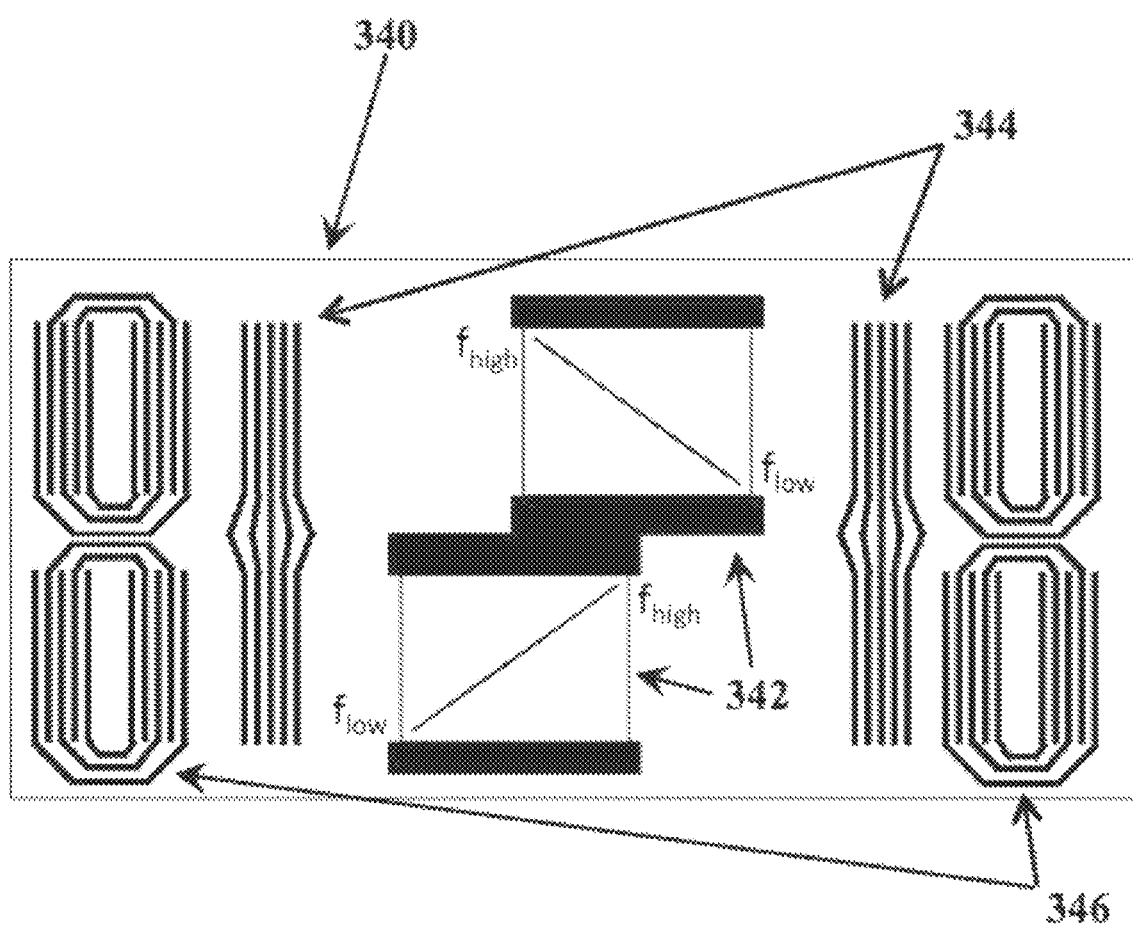
FIG. 15 shows a schematic representation of a device with track changing MSCs and ring-shaped MSC reflector elements and dispersive elements that uses pulse compression according to aspects of the present disclosure.

Another way to implement reversing track changing MSC elements according to the present invention would be to combine a track changing MSC with ring-shaped MSC reflector elements in an appropriate configuration. FIG. 15 shows one such device 340 embodiment that includes two transducers 342 with opposite chirps, two track changing MSCs 344 that would normally be 50% track changing MSCs, and four ring-shaped MSC reflectors 346. As above, the center transducers can be fed in parallel and can be separate or electrically connected on the die (as shown). Additional components could be added to enable this structure to be used as a sensor-tag interface device.

Figure 16:
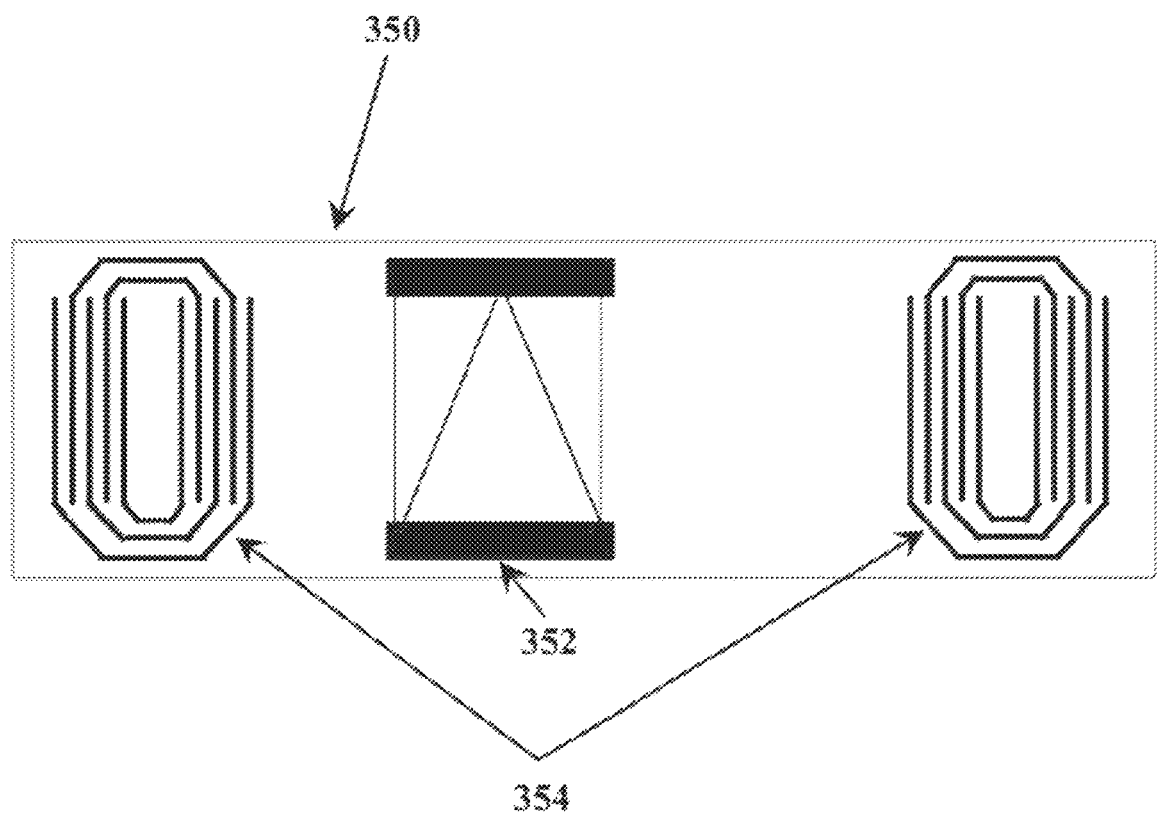
FIG. 16 shows a schematic representation of a compact, single acoustic track low loss differential delay line sensor using pulse compression according to aspects of the present disclosure.

A more compact, single acoustic track low loss differential delay line sensor 350 using pulse compression according to the present invention is shown FIG. 16. This embodiment uses a symmetrically chirped center transducer 352, surrounded by two ring-shaped MSC reflectors 354. The dispersive signal sent to the left (an upchirp followed by a downchirp is reflected, and generates a strong compressed pulse that is short in time duration when it is again time aligned with the input transducer. The same process happens to the right. Once again as a single transducer input device, there is no power division loss. Processing gain enhances output sensor signal levels considerably (easily by 20 db or more).

In the example device 350 shown in FIG. 16, a smooth upchirp is followed by a time-reversed downchirp. But any time-symmetric dispersive transducer construction could be used to similar effect, including step chirped, frequency coded chirped (wherein sections of the frequency chirp are 'cut' and 'shuffled' in time), nonlinear chirps, chirps of varying chirp slope, and others. Codes can also be introduced as mentioned previously, though for use in this structure any codes used in the transducer 352 must also be time symmetric.

Other devices according to aspects of this invention include embodiments that contain multiple acoustic tracks with duplicate copies of the structures above, with the same or different delays, and/or with other added SAW elements such as transducers, transducers attached to external sensor elements, reflectors (conventional or ring MSC reflectors), MSCs, and films or surface treatments to produce waveguiding, to short out the electric field at the surface, or to introduce sensitivity to a target measurand (as in magnetostrictive films, biological moieties, and chemically sensitive and selective films). The device embodiments described can be implemented using any of a number of surface-launched acoustic waves, including Rayleigh waves, flexural plate waves (FPWs), Love waves, surface transverse waves (STW), shear horizontal acoustic plate modes (SH-APM), layer guided acoustic plate modes (LG-APM), layer guided shear horizontal acoustic plate modes (LG-SHAPM), leaky surface waves, and pseudo-SAW modes. The transducers and/or reflectors described can be tapered, slanted, stepped tapered, apodized, withdrawal weighted, EWC, UDT, SPUDT, dispersive, and/or waveguide structures. All of these techniques can also be used incorporating dispersive and harmonic techniques.

The broad nature of the embodiments described here are clear, and one skilled in the art will understand that there is a wide variety of device configurations that can be generated using combinations of one or more of the techniques discussed. The embodiments of the inventions described herein and illustrated in the figures provide device embodiments capable of monitoring deposition of a wide range of materials, including but not limited to ultrathin films and nanomaterials. While some preferred forms and embodiments of the invention have been illustrated and described, it will be apparent to those of ordinary skill in the art that various changes and modifications can be made without deviating from the inventive concepts set forth above.

Inductive coupling and resonant magnetic coupling for remote reading of SAW sensors: To date, most wireless SAW sensors described in the literature have been activated via conventional antennas. Dipole, monopole, patch, microstrip, slot, and numerous other antenna configurations have been used to activate SAW sensors via conventional 'radiative' antennas that interact with propagating, time varying electromagnetic (EM) signals. Some SAW devices for use in liquids have been demonstrated that use inductive coupling to activate the SAW device wirelessly at short range (up to a cm or two). A range of applications exist for which it would be advantageous to produce wireless SAW sensors that can operate in media that are slightly to moderately conductive (such as sea water or heavy brine), and also in highly metallic environments. Conventional radiative antennas do not function properly when mounted on metal surfaces. EM signals experience excessively high loss in conductive or partially conductive media, as the conductivity tends to short out the electric field portion of the wave. Thus, alternative methods of activating and reading the sensors were needed. Since magnetic fields are not 'shorted out' by the conductivity of the media in which it exists, magnetic methods for transfer of power are more useful in high conductivity environments.

Resonant magnetic coupling has been demonstrated for power transfer by companies such as Witricity, enabling highly efficient wireless power transfer over several meters (in air). Magnetic communication of power and data through metal has also been demonstrated using magnetic signals. For example, Hydro-Tech (Corey Jaskolski, President) has used magnetic signals to transfer power and sensor data through metal cylinders. Resonant magnetic coupling once again provides a more efficient power transfer.

Certain aspects of the present invention disclose magnetic 'antennas' such as coils (planar and helical), magneto-electric monopoles and dipoles, with appropriate matching components, to activate and read SAW devices (sensors and sensor-tags, among others) in conductive environments. Various electrically insulating materials can be used to isolate the antenna from the surrounding environment. Helical coils can be circular, oval, rectangular, square, or other shape in cross section, and planar loops and coils can also be of many shapes, such as shapes similar to helical inductors among others. Other aspects of the present invention combine magnetic power transfer with electrical load modulation of the magnetic power signal for transfer of data. Magnetic 'antennas' can be mounted on or very close to metal surfaces, and can be used to activate SAW sensors and to receive sensor data. Such a method can operate in conductive media and on, around, and potentially through certain metal surfaces. Operation of SAW sensors in conductive fluids has been successfully demonstrated using aspects of the present invention.

Wireless measurement of current and voltage: SAW devices were shown in the early 1970's to be capable of measuring voltages directly, through the change in acoustic wave velocity produced by voltages applied transverse to the SAW die. However, the voltages required to produce significant changes in frequency or delay were large (hundreds of volts to kV) for realistic die thicknesses. More recent work has shown that SAW devices can be used with zero-bias (normally ON) field effect transistors (FETs) to produce wireless devices capable of reading voltages generated by external sensors (such as AE sensors, thermocouples, etc.). The external sensor voltage is applied as the gate to source (G-S) voltage on the FET, and modifies the drain to source (D-S) resistance of the FET. This D-S impedance is electrically connected as a load impedance across a SAW transducer, and changes in D-S resistance alter the SAW response reflected from the loaded transducer.

The hybrid FET/SAW sensor-tag wireless interface devices developed previously, and others using advantageous SAW embodiments according to aspects of the present invention described herein, can be used to measure electrical fields and magnetic fields, and by monitoring the magnitude and sign of the electrical field and the magnitude and direction of the magnetic field, can provide information on the voltage and current in high voltage lines (and other current carrying conductors), and on the relative phase (leading or lagging) of the current and voltage—providing information necessary to determine power factor. Such information can be useful, for example, in monitoring the condition of the power lines and other electrical equipment.

Another type of system according to specific aspects of the present invention is a passive wireless power line voltage, current, and temperature monitoring sensor system. This system utilizes SAW sensors or sensor tags with field probes to measure the electric field and magnetic field around current carrying conductors, which provide proxies for the voltage and current in the conductor. The distribution portion of the power grid runs essentially blind today, i.e., almost no real-time data is available to the grid operator on the condition of the distribution lines and transformers. Pinging smart meters can provide data on power outages at the individual meter level, but automated diagnostic tools that inform operators about the details, locations, and causes of outages are not available. Equally concerning, there are no prognostic tools for the grid that can predict component failures prior to problems occurring. Event driven condition based monitoring (CBM) of the distribution grid would enable operators to identify incipient failures, such as transformers nearing failure, and prioritize preventive maintenance to prevent outages. Since the cost of performing preventative maintenance is much lower than that of responding to an outage, such systems can reduce operating costs while enhancing grid stability. However, there are no current methods for distributed monitoring of the grid that are low enough cost to enable widespread monitoring, particularly at the local distribution level. Low-cost monitoring systems that can be distributed along power lines down to an individual span level of granularity could achieve unprecedented sensitivity in monitoring grid conditions.

Figure 17A:
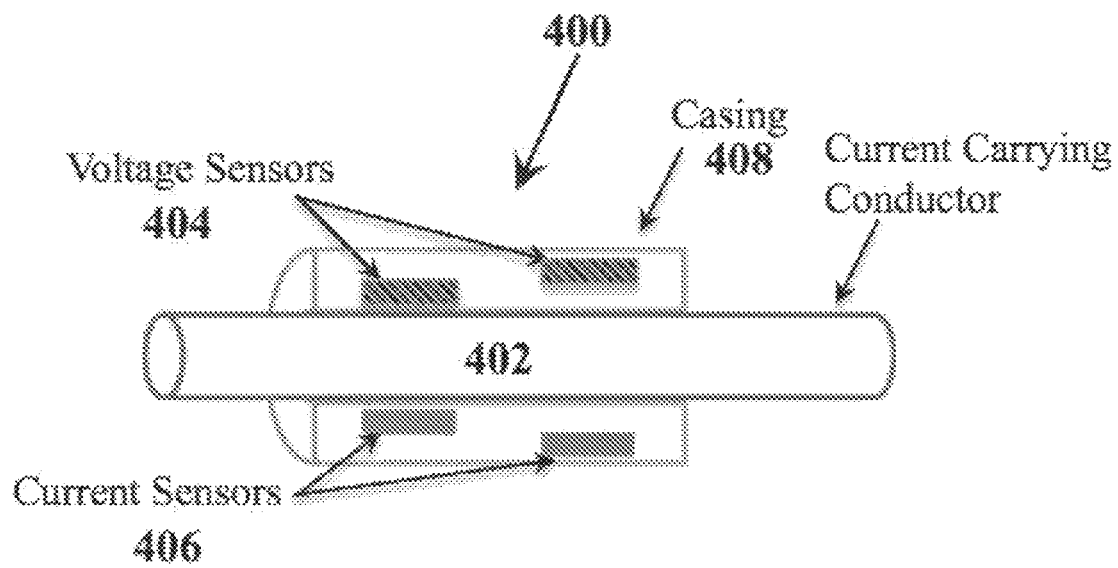
FIG. 17A shows a cut-away view of the interior of a voltage and current monitoring system according to aspects of the present disclosure.
Figure 17B:
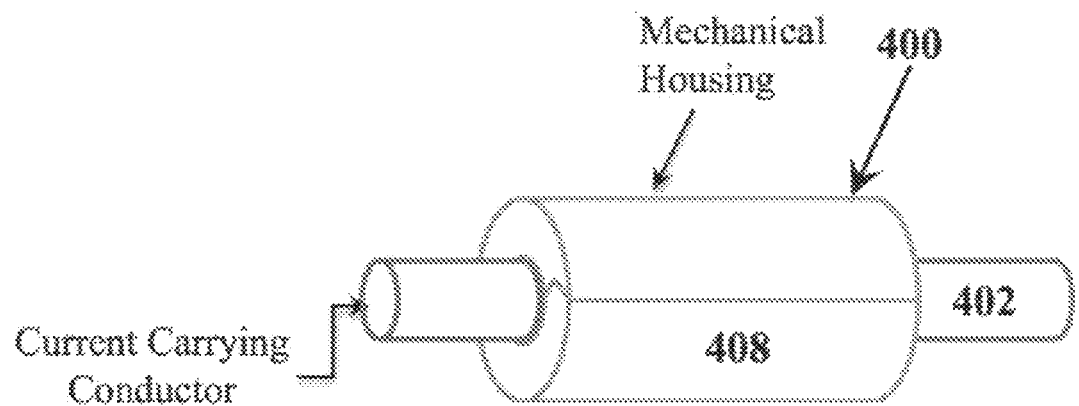
FIG. 17B shows the mechanical housing enclosing the conductor for the system shown in FIG. 17A according to aspects of the present disclosure.
Figure 18:
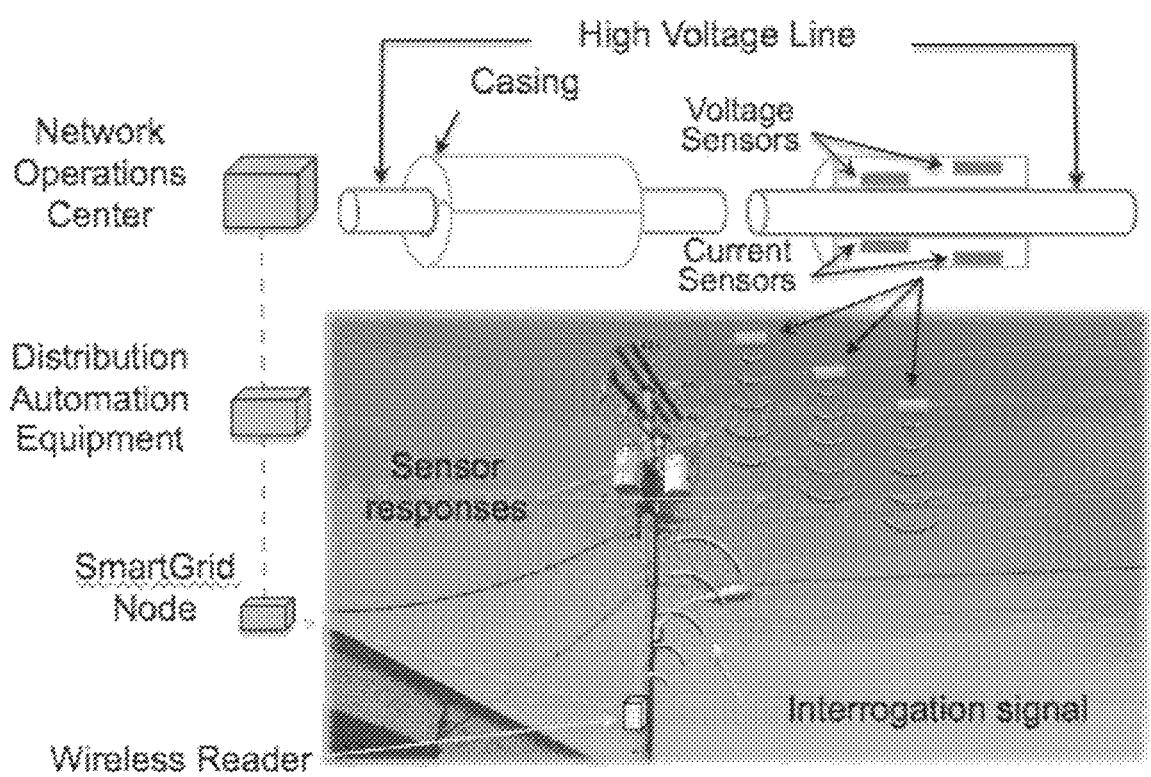
FIG. 18 shows the system of FIGS. 17A and 17B in operation on a three phase power line according to aspects of the present disclosure.

FIGS. 17A and 17B show various schematic representations of a voltage and current monitoring system 400 according to aspects of the present disclosure. FIG. 17A shows a cut-away view of the interior of the system's casing 408, which serves as mechanical housing for the current sensors 406 and the voltage sensors 404, as well as providing a mounting means to attach the system to a current carrying conductor 402, including hot stick mounting for power lines. FIG. 17B shows the system with the mechanical housing 400 closed around the conductor 402. FIG. 18 shows the concept for system operation on a three phase power line according to aspects of the present disclosure. Each or the three phase conductors has a wireless, batteryless sensor module that corresponds to the system 400 shown in FIGS. 17A and 17B mounted on the line. A wireless interrogator, also referred to as a reader or a radio, is mounted on the pole below the power lines. The reader sends RF signals that activate the sensor systems on the lines, then receives and digitizes the reflected sensor system RF responses. After local signal processing, sensor data can be transferred to the grid operator via the smart grid network, or via cellphone car wireless mesh networks, or any desired wireless communication system or protocol. A single reader can collect and interpret data from multiple sensors (up to thirty-two or more in the field of view of one interrogator). Moving all of the digital signal processing (DSP) and wireless communications hardware to a reader that can be mounted in an accessible location away from the power line or transformer being monitored reduces cost and enhances system reliability compared to systems with radios mounted on the high voltage lines. The SAW devices used operate in harsh environments, and have demonstrated lifetimes in excess of several decades in challenging environments.

How the SAW sensor-tag assembly modules measure voltage and current: Placing a loop of wire in (and perpendicular to) the magnetic field generated by a time varying current on an AC power line will cause a current to be induced in the wire loop. For an ideal open circuited loop, this current induces a voltage across the open ends of the loop. By connecting the ends of the loop to a full bridge rectifier and then to the gate of a FET, a time varying drain to source FET impedance can be generated as the current in the power line changes.

Figure 19:
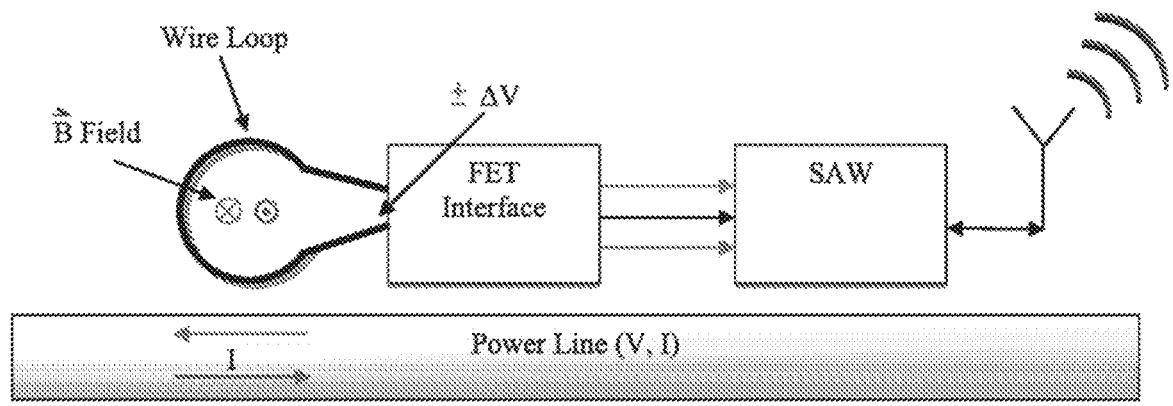
FIG. 19 shows a schematic representation of a wireless, batteryless SAW current sensor-tag assembly according to aspects of the present disclosure.

FIG. 19 shows a schematic representation of a wireless, batteryless SAW current sensor-tag assembly according to aspects of the present disclosure. This assembly includes a magnetic field probe sensor connected to a FET interface module, a SAW sensor-tag, and an antenna. The SAW sensor-tags provide a wireless interface with the FET(s), reading the D-S impedance that is being modified by the field probe voltage applied to the FET gate, thus monitoring the magnetic field and ultimately the line current. In an alternate embodiment of the present invention, a Rogowski coil placed around the wire, with the gate and source of the FET attached across the coil ends, can be used instead of a simple loop shown in Figure A, making the voltage less dependent on positioning of the coil relative to the power line. Using a FET interface according to the present invention, the SAW sensor will be able to detect current magnitude and direction by detecting the strength and orientation of the magnetic field produced. Data gathered by the interrogator can include current magnitude and direction as a function of time. This data can be collected for each phase of the power system, allowing extraction of the relative current amplitude and phase information.

Figure 20:
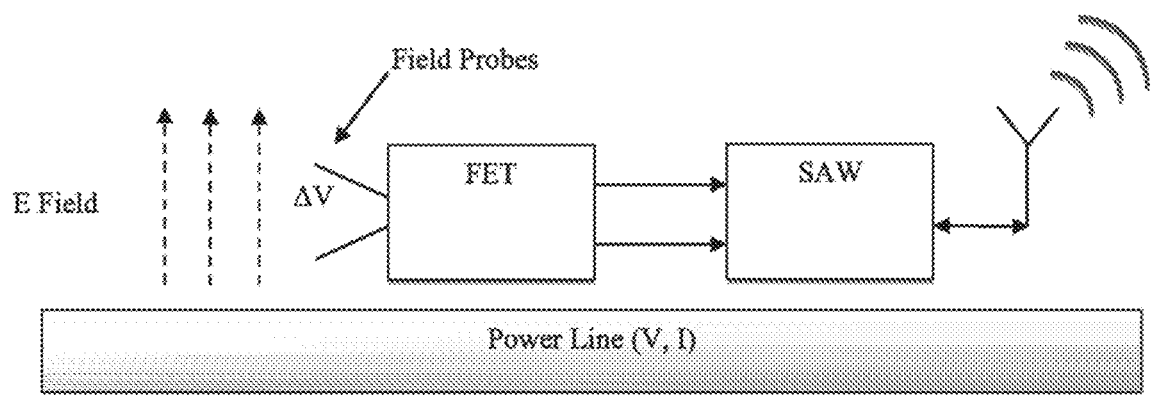
FIG. 20 shows a schematic representation of a wireless, batteryless SAW voltage sensor-tag assembly according to aspects of the present disclosure.

FIG. 20 shows a schematic representation of a wireless, batteryless SAW voltage sensor-tag assembly according to aspects of the present disclosure. Once again, the assembly consists of a field probe that can produce a voltage based on the electric field, a FET interface, a SAW sensor-tag, and an antenna, although in this case the field probe is designed to detect the electric field. Around an AC power line, a time-varying electric field will form with a field intensity that is directly related to the voltage on the line. Field intensity falls off approximately as the inverse of the radial distance from the line. By placing two radially separate probes in the field, a voltage difference between the probes can be measured and used to drive a FET attached to one of the SAW sensor tags disclosed herein. As with the current monitoring case, the time varying impedance of the FET will load the SAW tag and allow wireless reading of the impedance of the FET. As a result, we can monitor the field intensity and by extension, the line voltage. Since the electric field falls off to ground over a distance corresponding to the distance from the line to ground, which can vary from location to location and with different line types, the electric field intensity at any given distance from the line will also vary with these factors. Thus, measuring the electric field intensity will only provide a scaled measure of the voltage on the line, unless a calibration can be done to establish the absolute voltage on the line relative to ground.

Figure 21:
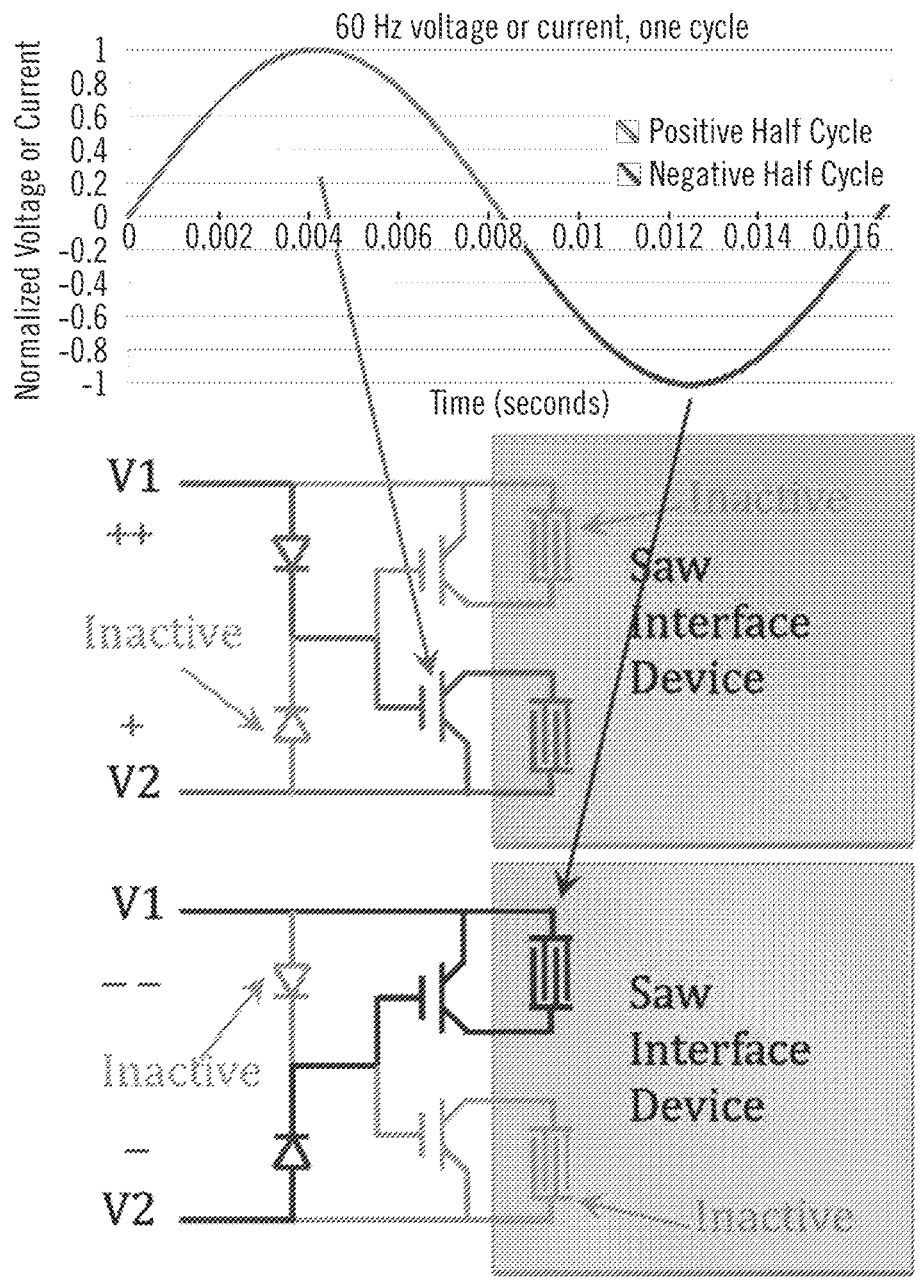
FIG. 21 shows a SAW wireless interface device configuration with multiple FETs for use in monitoring current (magnitude and direction) and voltage (magnitude and polarity) according to aspects of the present disclosure.

A complete line monitoring sensor system (400 in FIGS. 17A and 17B) for use on AC power systems requires that both current and voltage are measured during both positive and negative portions of the nominally 60 Hz cycle, in order to allow determination of the direction of current flow. Finding the relative phase between the current and voltage also requires accurate zero crossing detection for both signals. FIG. 21 shows a SAW wireless interface device configuration with multiple FETs for use in monitoring current (magnitude and direction) and voltage (magnitude and polarity) according to aspects of the present disclosure. The field probes that produce voltages V1 and V2 are loops (or a Rogowski coil) for detection of time varying magnetic fields and simple electrical probes (similar to simple monopole antennas) for electrical field measurement.

For field effect transistors (FETs), the Gate to Source (G-S) voltage controls Drain to Source (D-S) impedance of FET. Some FETs exhibit D-S impedance characteristics that are desirable for use with SAW devices with positive G-S voltages, while others exhibit D-S impedance characteristics that are desirable for use with SAW devices with negative G-S voltages, and yet others function with G-S voltages that span zero voltage.

For the SAW/FET configuration shown in FIG. 21, two voltages are pulled from the field probes (which measure the electric or magnetic field), producing a time-varying differential voltage of magnitude $|V_1(t)-V_2(t)|$, and diodes are used to control application of the probe voltages to one of two FETs depending on the sign of the differential input. On the positive half cycle of the line current or voltage (the waveform shown), V1 is more positive than V2, activating the top diode and applying V1 to the gate of the bottom FET, with V2 applied to the FET source. With proper FET selection, this applied voltage causes an impedance change in the drain to source of the lower FET, which modifies the reflectivity of the attached SAW transducer. Changes in the acoustic wave signal reflected from the transducer can be interpreted as a change in FET resistance, or gate voltage, or ultimately electric or magnetic field strength. On the negative half cycle, V1 is more negative that V2, causing the top diode to shut off and the bottom diode to activate. Now, V2 is routed to the gate of the top FET, and V1 is applied to the source. This modifies the drain to source impedance of the FET attached to the top SAW transducer. In this way, the positive and negative halves of an input differential signal from the field probes are separately identifiable and measurable.

The discussion above assumes ideal diodes that have essentially zero threshold voltage. The use of realistic diodes for input signal routing, however, impacts the performance of this approach, in that most real diodes have non-zero threshold voltages ($V_{TH}$) that can be as much as 0.7V (typically). This is the voltage at which the diode turns on. Thus, the voltages routed to the FET gates are lowered by the threshold voltage of the diodes. The zero voltage crossing point of the input signal also can become difficult to track due to the diode threshold voltage. This turn-on voltage could cause the circuit shown in FIG. 21 to exhibit a 'dead zone' where the system is non-responsive for differential probe outputs from $-V_{TH}$ to $+V_{TH}$ (typically from about -0.7V to +0.7V), though careful selection of low threshold voltage diodes may reduce the dead-zone.

Figure 22:
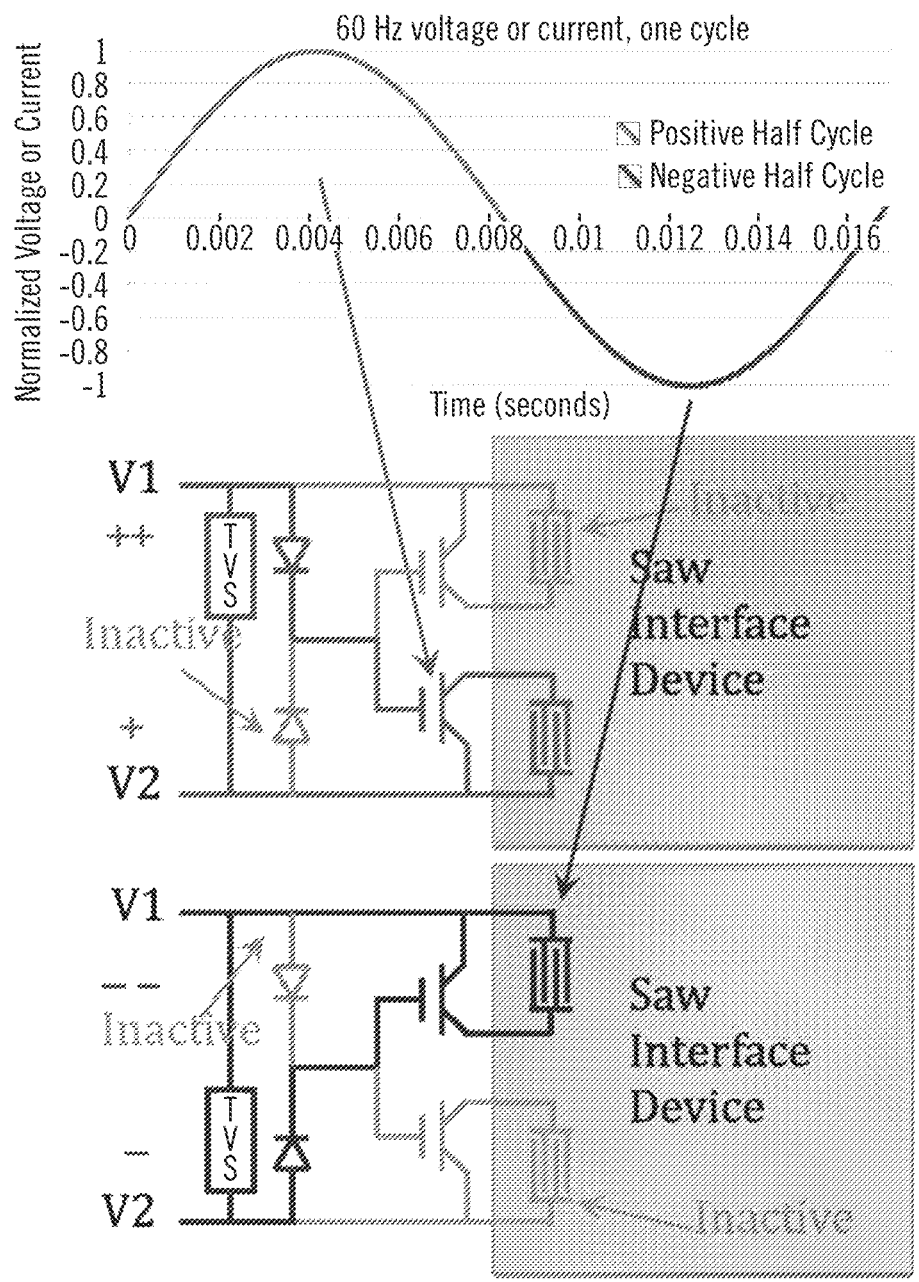
FIG. 22 shows the circuit of FIG. 21 with added transient voltage suppression (TVS) devices across the two leads of the field probe according to aspects of the present disclosure.

Since the SAW sensor-tag assemblies will be operating in a high voltage power line environment, where transients are not uncommon, it is important to include protective circuitry. FIG. 22 shows the circuit of FIG. 21, with added TVS devices across the two leads of the field probe. This ensures that, even if there is a surge in current or voltage on the line, the differential output of the field probe will not exceed a predetermined level.

A complete monitoring system 400 in FIG. 17 will include two SAW sensor-tag assemblies (shown in FIG. 22), one to monitor the line voltage and one to monitor line current. In addition, one embodiment of the present invention includes a SAW temperature sensor to determine the power line temperature. All of these sensors and sensor-tags can be implemented on a single substrate, or alternatively it is possible to utilize multiple substrates used together to implement the sensor-tag assemblies in one embodiment of the present invention. Two or more die can be used, potentially a reference die and one or more sensing die. The die can be mounted together in a common sample plenum, or the reference device can be hermetically sealed in one package while the sensing die is exposed to the media of interest in another package. The reference die can be combined with one or more sensing die for temperature or other parameters, and hermetically sealed in a package. This package can be electrically connected to an external sensing die, which loads the acoustic response on one of the sensing die or tracks.

The illustrations included herein are exemplary in nature, and do not encompass all aspects of the present invention. One skilled in the art would recognize that the improvements provided by embodiments of this invention can be implemented to work with any of a wide range of known SAW sensor and sensor-tag structures, including but not limited to those incorporating various diversity techniques (code, chirp, time, and frequency diversity among others). A wide range of known coding techniques can be implemented in combination with the embodiments described. It would be understood by one versed in the art that simple on-off keying, phase modulation, pulse position modulation, and many other techniques could be used with the techniques described herein to enhance the number of codes that work together without interference. Frequency diversity, code diversity, time diversity, and other known techniques can be combined to achieve sets of devices with desirable properties. Any of these techniques could be utilized in the aforementioned device embodiments to increase the number of sensors that can work together in a system. Devices utilizing such structures could also be useful for RFID tag and sensor-tag applications, where identification of individual devices is desired. In addition, combinations of these techniques may be advantageous in certain circumstances.

Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A surface acoustic wave sensor tag device, comprising:
a piezoelectric substrate;
at least one transducer arranged on at least a portion of said piezoelectric substrate; and
at least one surface acoustic wave element formed on said piezoelectric substrate and spaced from said at least one transducer along a direction of acoustic wave propagation,
wherein said at least one surface acoustic wave element includes at least one multistrip coupler;
wherein at least one of said at least one transducer or said at least one surface acoustic wave element further comprises dispersive electrode structures; and
wherein said at least one transducer further comprises a dispersive transducer with a time symmetric dispersion pattern.

2. A surface acoustic wave sensor tag device according to claim 1, wherein said dispersive transducer with said time symmetric dispersion pattern is located between two or more reflectors.

3. A surface acoustic wave sensor tag device according to claim 2, wherein said two or more reflectors are comprised of ring shaped multistrip coupler reflectors.

* * * * *